United States Patent
Kobayashi

(10) Patent No.: US 12,243,896 B2
(45) Date of Patent: Mar. 4, 2025

(54) PHOTOELECTRIC CONVERSION APPARATUS, PHOTOELECTRIC CONVERSION SYSTEM, MOBILE BODY, AND SEMICONDUCTOR SUBSTRATE

(71) Applicant: CANON KABUSHIKI KAISHA, Tokyo (JP)

(72) Inventor: Masahiro Kobayashi, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 447 days.

(21) Appl. No.: 17/584,978

(22) Filed: Jan. 26, 2022

(65) Prior Publication Data
US 2022/0246664 A1    Aug. 4, 2022

(30) Foreign Application Priority Data
Feb. 4, 2021 (JP) ................... 2021-016449

(51) Int. Cl.
| | |
|---|---|
| *H01L 27/146* | (2006.01) |
| *H04N 23/617* | (2023.01) |
| *H04N 25/78* | (2023.01) |
| *H04N 25/79* | (2023.01) |

(52) U.S. Cl.
CPC .. *H01L 27/14636* (2013.01); *H01L 27/14634* (2013.01); *H04N 23/617* (2023.01); *H04N 25/78* (2023.01); *H04N 25/79* (2023.01)

(58) Field of Classification Search
None
See application file for complete search history.

(56) References Cited

U.S. PATENT DOCUMENTS

2015/0156432 A1* 6/2015 Tozawa ............... H04N 25/709
348/302

FOREIGN PATENT DOCUMENTS

| | | | | | |
|---|---|---|---|---|---|
| CN | 112470462 | A | * | 3/2021 | ......... G06F 18/2413 |
| CN | 112889267 | A | * | 6/2021 | ............ G06N 3/063 |
| JP | 2013140630 | A | | 7/2013 | |
| JP | 2020025261 | A | | 2/2020 | |
| JP | 2020025263 | A | | 2/2020 | |
| JP | 2020025265 | A | | 2/2020 | |
| JP | 2020072410 | A | | 5/2020 | |
| JP | 2020191334 | A | | 11/2020 | |
| KR | 20210032298 | A | * | 7/2019 | |
| WO | 2016151837 | A1 | | 9/2016 | |
| WO | WO-2020090509 | A1 | * | 5/2020 | ............ G06N 3/063 |

OTHER PUBLICATIONS

English translation of WO-2020090509-A1, Eki, 2020 (Year: 2020).*

(Continued)

*Primary Examiner* — James M Hannett
(74) *Attorney, Agent, or Firm* — Canon U.S.A., Inc. IP Division

(57) ABSTRACT

An apparatus includes a first substrate having a pixel area and a second substrate superimposed on the first substrate, a first processing unit for processing signals output from a plurality of pixels, and a second processing unit for performing processing based on a calculation model. At least part of the first processing unit and at least part of the second processing unit are disposed on either the first substrate or the second substrate. A first power supply voltage to the first processing unit and a second power supply voltage to the second processing unit are supplied via different paths.

21 Claims, 24 Drawing Sheets

(56) References Cited

OTHER PUBLICATIONS

English translation of KR-20210032298-A, Murase, 2019 (Year: 2019).*
English translation of CN-112889267-A, Eki, 2021 (Year: 2021).*
English translation of CN-112470462-A,, Eki, 2021 (Year: 2021).*

* cited by examiner

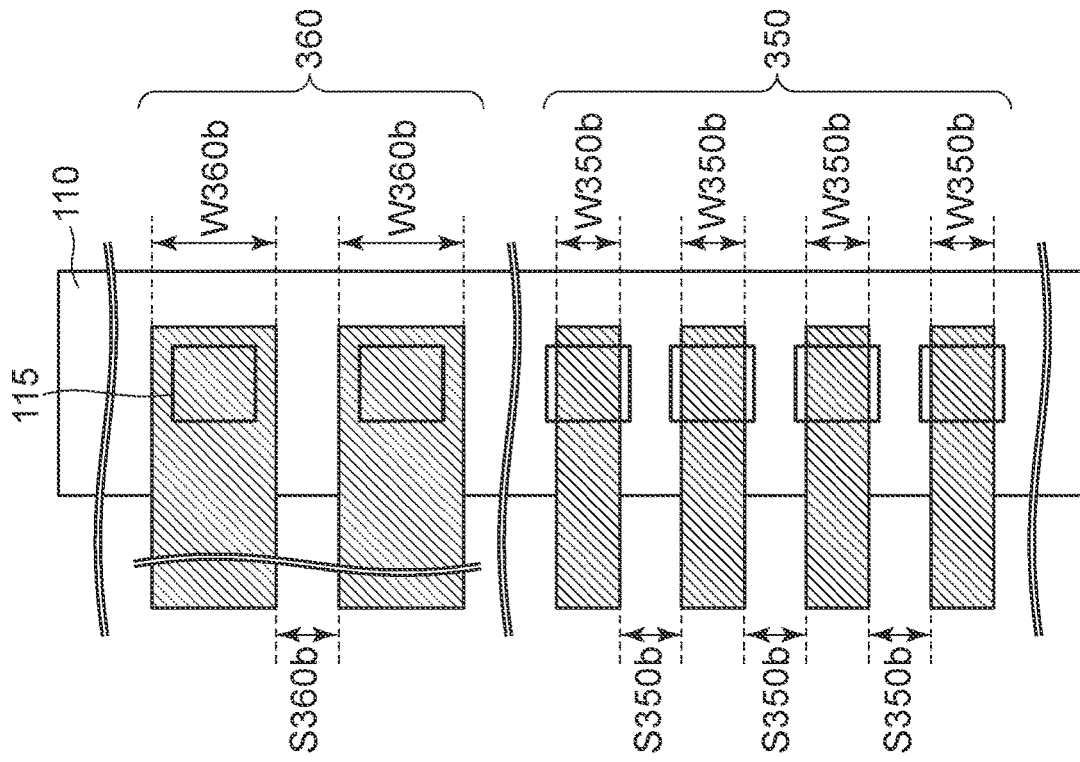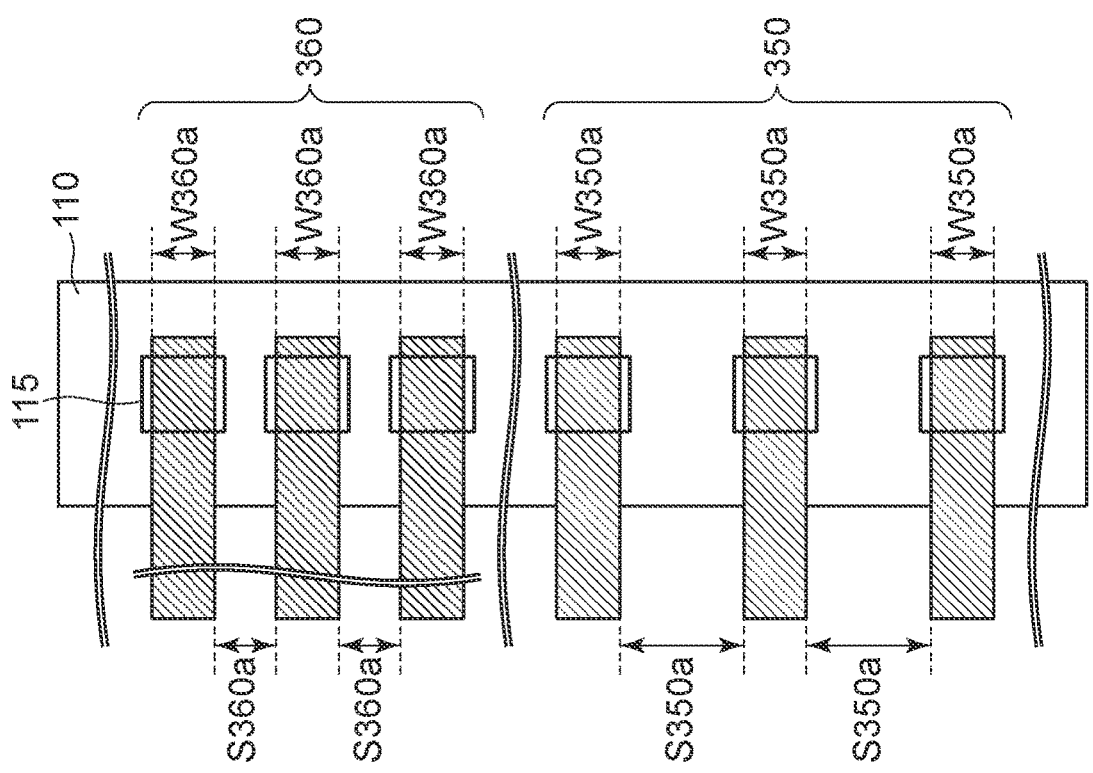

FIG. 19B
FRONT VIEW
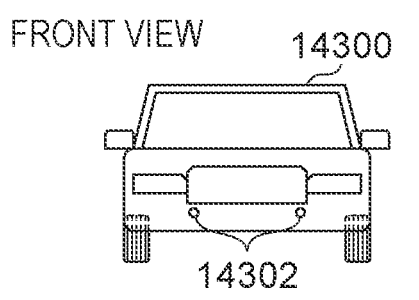
14300
14302
TOP VIEW
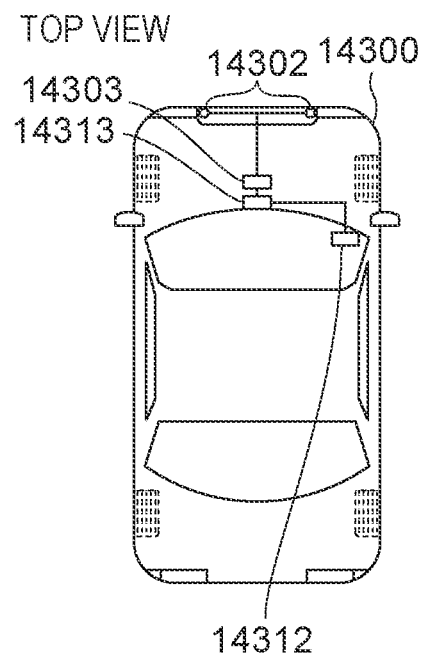
14303
14313
14302 14300
14312
REAR VIEW
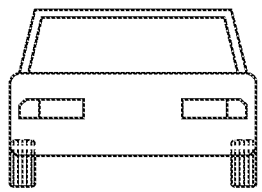

PHOTOELECTRIC CONVERSION APPARATUS, PHOTOELECTRIC CONVERSION SYSTEM, MOBILE BODY, AND SEMICONDUCTOR SUBSTRATE

BACKGROUND

Field of the Disclosure

The aspect of the embodiments relates to a photoelectric conversion apparatus, a photoelectric conversion system, a mobile body, and a semiconductor substrate.

Description of the Related Art

Japanese Patent Laid-Open No. 2020-025263 describes a multilayer light receiving sensor formed in a multilayer structure in which a first semiconductor substrate and a second semiconductor substrate are disposed in a one-on-another manner. On the second semiconductor substrate, a processing unit is disposed which executes processing based on a neural network calculation model on image data obtained from a pixel array disposed on the first semiconductor substrate.

SUMMARY OF THE DISCLOSURE

According to an aspect, an embodiment provides an apparatus including a first substrate having a pixel area in which a plurality of pixels are arranged, and a second substrate superimposed on the first substrate and electrically connected to the first substrate, the apparatus further including a first processing unit for processing signals output from the plurality of pixels, and a second processing unit for performing a process based on a calculation model on a signal output from the first processing unit, at least part of the first processing unit and at least part of the second processing unit being disposed on either the first substrate or the second substrate, a first path for supplying a first power supply voltage to the first processing unit is different from a second path for supplying a second power supply voltage to the second processing unit.

Further features of the disclosure will become apparent from the following description of exemplary embodiments with reference to the attached drawings.

BRIEF DESCRIPTION OF THE DRAWINGS

FIGS. 14A and 14B each are a schematic plan view showing details of a wiring configuration.

FIG. 19A is a diagram illustrating a photoelectric conversion system and FIG. 19B is a diagram illustrating a mobile body.

DESCRIPTION OF THE EMBODIMENTS

To execute processing based on a neural network calculation model, a processing unit for this purpose generally consumes large power. A local power consumption in a photoelectric conversion apparatus may cause a fluctuation of a power supply voltage, which may cause, via capacitive coupling, a fluctuation of a voltage on a signal line or a power supply line. Such a fluctuation may cause an erroneous operation of a semiconductor apparatus. When the photoelectric conversion apparatus is used to acquire an image, such a fluctuation may cause a degradation in image quality.

In addition, the amount of heat generated by the processing unit increases in proportion to the increase in power consumed by the processing unit. If the amount of heat exceeds a maximum allowable value depending on the heat resistance of the semiconductor element, a problem may occur in the operation of the processing unit of the semiconductor apparatus. In particular, in the photoelectric conversion apparatus, there is a possibility that the heat generation causes an increase in a dark current of a photodiode, which may result in degradation in the image quality.

In view of the above problems, the present disclosure provides a semiconductor apparatus with a configuration that effectively reduces at least one of a power supply fluctuation and heat generation caused by a processing unit.

Embodiments of the present disclosure will be described below with reference to the drawings. In the following description of the embodiments, duplicated descriptions of the same units/configurations as those of other embodiments will be omitted. Techniques of the respective embodiments can be modified and combined as appropriate.

In each embodiment described below, as an example of a semiconductor apparatus, a photoelectric conversion apparatus for acquiring a two-dimensional image is described. However, the semiconductor apparatus is not limited to such a photoelectric conversion apparatus. For example, semiconductor apparatuses to which the present disclosure may be applied include a photoelectric conversion apparatus configured to acquire a one-dimensional image, a photoelectric conversion apparatus for use in ToF (Time of Flight) applications, a sensor for detecting light or electromagnetic waves with wavelengths other than visible light, a memory apparatus, and so on.

First Embodiment

A multilayer photoelectric conversion apparatus capable of acquiring a two-dimensional image is described below as a photoelectric conversion apparatus according to a first embodiment. The multilayer photoelectric conversion apparatus includes a plurality of substrates which are put in a layer-on-layer manner. In this embodiment, it is assumed by way of example that the multilayer photoelectric conversion apparatus includes two substrates put together such that one substrate is put on the other.

Figure 1:
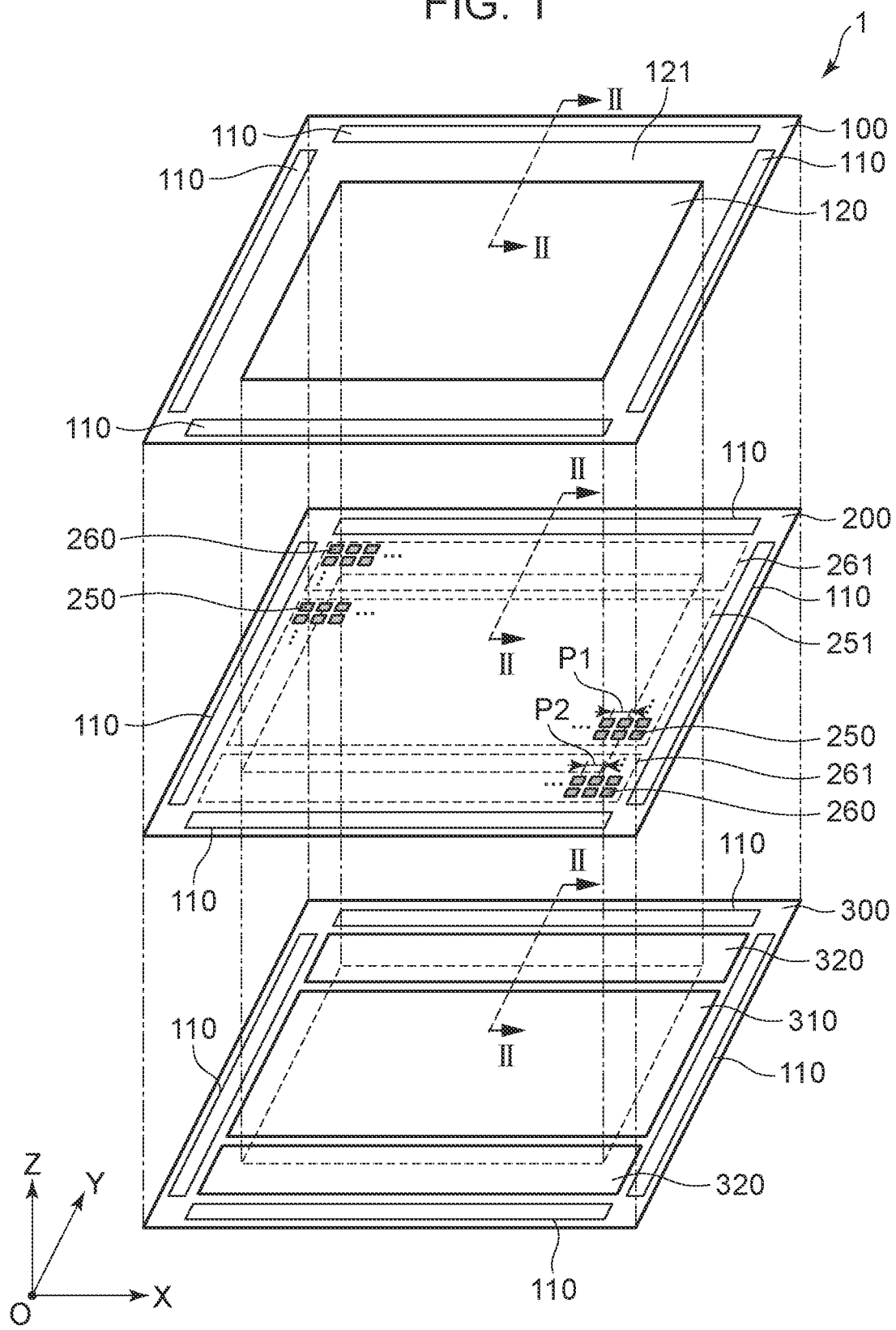
FIG. 1 is a schematic plan view of a photoelectric conversion apparatus according to a first embodiment.

FIG. 1 is a schematic plan view of the photoelectric conversion apparatus according to the present embodiment. In FIG. 1, the two substrates are separated from the combined state and shown in the form of a perspective view. The photoelectric conversion apparatus 1 includes a first substrate 100 and a second substrate 300. On each of the first substrate 100 and the second substrate 300, elements and wiring structures are formed on a semiconductor substrate. The semiconductor substrate may be thinned as necessary. That is, the photoelectric conversion apparatus 1 is configured such that the two semiconductor substrates on which elements and/or the like are formed are combined in the multilayer structure. Each semiconductor substrate is, for example, a single crystal silicon substrate, which is also called a silicon wafer or a semiconductor wafer. A connection plane 200 in FIG. 1 is a schematic representation of a plane where the first substrate 100 and the second substrate 300 are in contact with each other. Broken lines represent parts projected from the first substrate 100 and the second substrate 300. When the first substrate 100 and the second substrate 300 are put together, these parts are superimposed on each other. Alternate long and short dash lines connect the portions which are superimposed when the first substrate 100 and the second substrate 300 are put together into the multilayer structure. In FIGS. 1, X and Y directions are perpendicular to each other, and a Z direction is perpendicular to a plane including the X and Y directions.

The first substrate 100 includes a plurality of pad parts 110, a pixel part 120, and a peripheral part 121. Each of the plurality of pad parts 110 includes a plurality of pads for inputting/outputting signals and for supplying power. A plurality of unit cells are arranged in a matrix form in the pixel part 120. The pixel part 120 may also be called a pixel area. In the present embodiment, the unit cell outputs an image signal, and it may also be referred to as a unit pixel or the like. In other types of semiconductor apparatuses, the unit cell may be, for example, a memory element. An image signal is a signal for forming an image such as a signal based on light (an optical signal) or a signal provides a reference (a reference signal). The pixel part 120 is rectangular when seen in a plan view. The peripheral part 121 is a part other than the pixel part 120 and the pad parts 110. In FIG. 1, the first substrate 100 includes four pad parts 110. The four pad parts 110 are disposed so as to surround the rectangle. In other words, the pixel part 120 is located between the two pad parts 110 in the X direction in FIG. 1, and between the two pad parts 110 in the Y direction in FIG. 1. The pad parts 110 each include pads for connecting to an external apparatus, a protection circuit, and/or the like.

The number of pixel parts 120 possessed by the first substrate 100 is not limited to one, and the first substrate 100 may include a plurality of pixel parts 120. The shape of the pixel part 120 is not limited to a rectangle, and the pixel part 120 may have any shape. The number of pad parts 110 included in the first substrate 100 is not limited to four. The first substrate 100 have no pad parts 110. The pad parts 110 may be disposed in an arbitrary form at arbitrary locations on the first substrate 100. For example, pad parts may be disposed in an L-shaped manner such that one pad part 110 is disposed along the X direction and another pad part 110 is disposed along the Y direction.

The second substrate 300 includes a first signal processing unit 310, a plurality of second signal processing units 320, and a plurality of pad parts 110. In FIG. 1, the first signal processing unit 310 is located between the two second signal processing units 320. The number, the shape, and the locations of the first signal processing unit 310, the second signal processing units 320, and the pad parts 110 are not limited to those shown in FIG. 1.

The first signal processing unit 310 is a unit that processes an image signal output from the pixel part 120. The first signal processing unit 310 outputs image data. The first signal processing unit 310 may include an amplifier circuit, an analog-to-digital conversion circuit (hereinafter referred to as an AD conversion circuit), a column memory, and/or the like. The amplifier circuit reads and amplifies the signal output from the pixel part 120. In a case where the signal output from the pixel part 120 is in the form of an analog signal, the AD conversion circuit converts the analog signal into a digital signal. Examples of the signal processing performed by the first signal processing unit 310 include amplification processing, AD conversion processing, addition/subtraction processing, thinning processing, resolution conversion processing, and image processing such as noise removal processing, white balance adjustment processing, and/or the like. The signal processing performed by the first signal processing unit 310 includes preprocessing for processing by the second signal processing unit 320.

The second signal processing unit 320 includes a processing circuit for executing AI (Artificial Intelligence) processing or the like based on the neural network calculation model on the image data. The second signal processing unit 320 may include a memory unit for storing a learning model obtained by learning weighting coefficients of the neural network. The processing performed by the second signal processing unit 320 is AI processing, and thus the second signal processing unit 320 may be called an AI processing unit. The neural network calculation model is a trained model built via machine learning.

The connection plane 200 has a first connection area 251 and two second connection areas 261. In the first connection area 251, a plurality of first connection parts 250 are arranged two-dimensionally. In the second connection area 261, a plurality of second connection parts 260 are arranged two-dimensionally. The numbers and shapes of the first connection area 251 and the second connection area 261 are not limited to those shown in FIG. 1. Each of the first connection parts 250 and the second connection parts 260 is rectangular when seen in a plan view. The first connection parts 250 and the second connection parts 260 are made of a conductor. More specifically, the first connection parts 250 and the second connection parts 260 are made of a metal containing copper as a main component.

The overlap of the first substrate 100 and the second substrate 300 indicated by the alternate long and short dash lines in FIG. 1 is described below. The four corners of the first substrate 100 overlap the four corners of the second substrate 300. That is, the end portions of the first substrate 100 overlap the end portions of the second substrate 300. The pixel part 120 of the first substrate 100 is superimposed on the two second signal processing units 320 and the first signal processing unit 310 of the second substrate 300. The pixel part 120 of the first substrate 100 overlaps the two second connection areas 261 and the first connection area 251 of the connection plane 200. Each second connection area 261 overlaps corresponding one of the second signal processing units 320, and the first connection area 251 overlaps the first signal processing unit 310.

Figure 15:
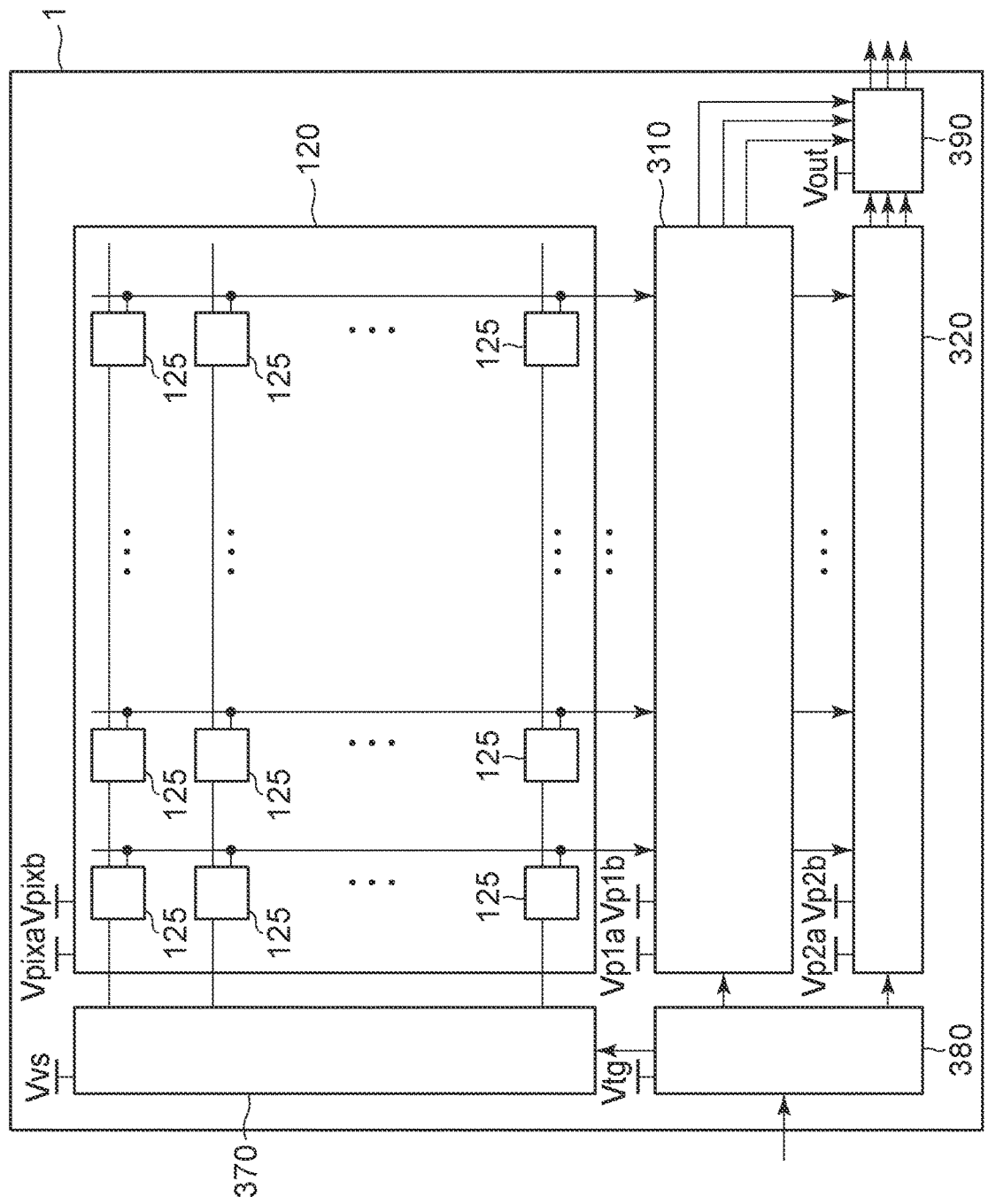
FIG. 15 is a block diagram of a photoelectric conversion apparatus.

FIG. 15 is a block diagram showing circuit blocks of the photoelectric conversion apparatus 1 according to the present embodiment. The photoelectric conversion apparatus 1 includes the pixel part 120, a scanning circuit 370, the first signal processing unit 310, the second signal processing unit 320, a drive circuit 380 including a timing generator (hereinafter, referred to as TG), and an output circuit 390. Unit cells 125 are arranged two-dimensionally in the pixel part 120. The unit cell 125 is also referred to as a unit pixel or the like. The scanning circuit 370 supplies a power supply voltage and a control signal to each unit cell 125 of the pixel part 120 thereby controlling the operation of each unit cell 125. Examples of the operations are accumulating an optical signal, resetting an optical signal, reading an optical signal, and so on. More specifically, the control operation performed by the scanning circuit 370 is to select a unit cell 125 based on XY addresses. In the present example, the scanning circuit 370 is formed in one block, but it may include a plurality of blocks. For example, the scanning circuit 370 may include a block that controls the horizontal operation of the pixel part 120 and a block that controls the vertical operation of the pixel part 120. The drive circuit 380 receives a signal from the outside of the photoelectric conversion apparatus 1 and supplies drive signals to the scanning circuit 370, the first signal processing unit 310, and the second signal processing units 320. The first signal processing unit 310 and the second signal processing units 320 operate as described above. The output circuit 390 converts the signals from the first signal processing unit 310 and the second signal processing units 320 into output signals, and outputs the resultant output signals to the outside of the photoelectric conversion apparatus 1. Power supply voltages applied to the respective signal processing units will be described later. The units and the parts described above may be disposed at suitable locations on the first substrate 100 or the second substrate 300. In the present embodiment, these units/parts are disposed as described with reference to FIG. 1.

Signal paths are described below with reference to FIGS. 15 and 1. Image signals output from the pixel part 120 are applied to the first signal processing unit 310. The image signals processed by the first signal processing unit 310 are output from the first signal processing unit 310 to the second signal processing unit 320. In a case where a plurality of second signal processing units 320 are provided as in FIG. 1, the image signal is output to one of the second signal processing units 320. For example, one second signal processing unit 320 may be provided corresponding to a unit cell of the first signal processing unit 310, or one second signal processing unit may be provided corresponding to a row of the matrix of the pixel part 120. The numbers of respective circuit blocks such as the pixel part 120, the first signal processing unit 310, and the second signal processing unit 320, and the relationships among them may be appropriately selected.

Figure 2:
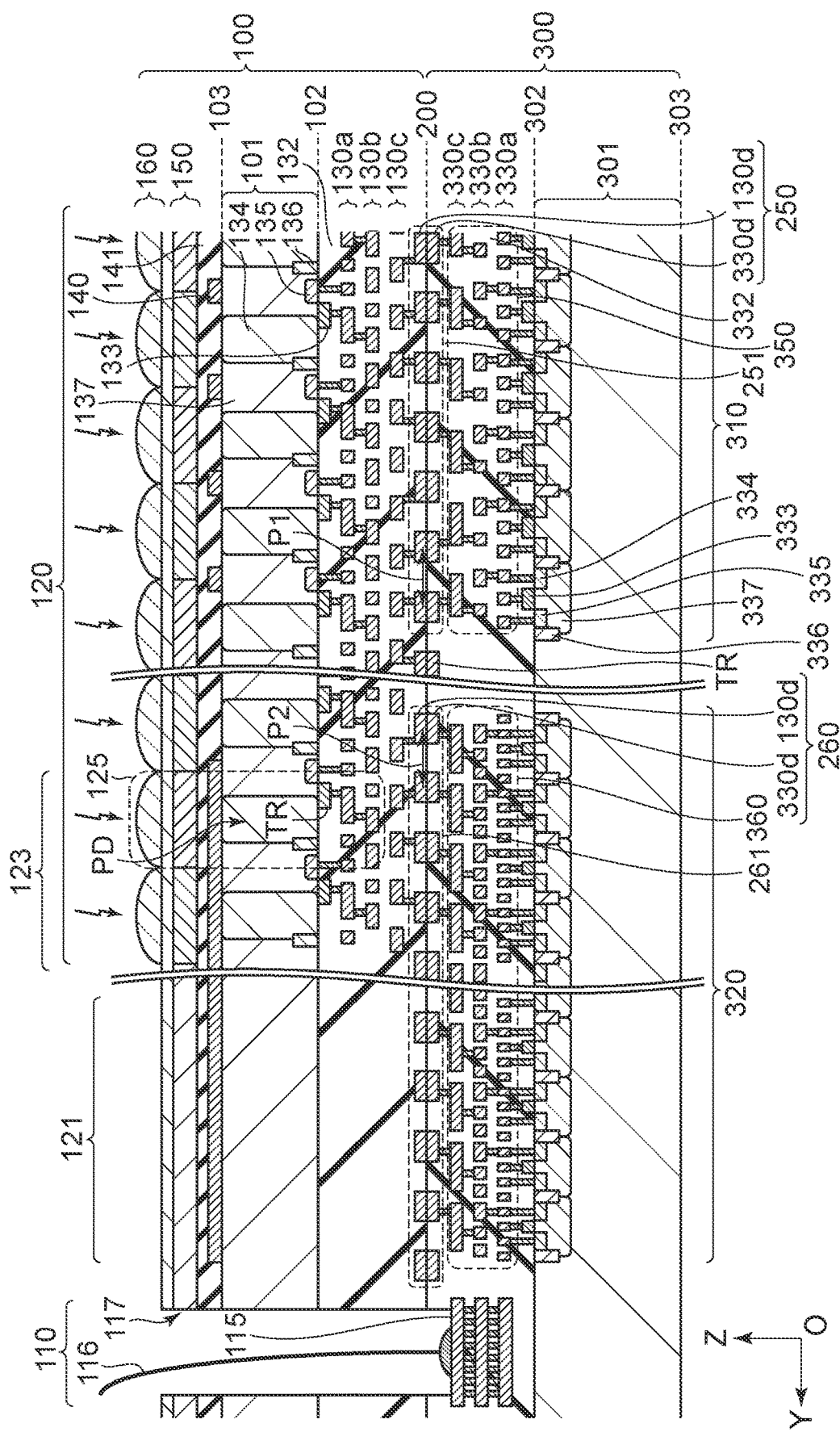
FIG. 2 is a schematic cross-sectional view of the photoelectric conversion apparatus according to the first embodiment.

FIG. 2 is a schematic cross-sectional view of the photoelectric conversion apparatus 1 taken along a line II-II in FIG. 1 according to the present embodiment. The first substrate 100 includes a semiconductor layer 101, a plurality of wiring layers 130, an interlayer insulating film 132, a wiring layer 130*d*, a light shielding layer 140, an insulating film 141, a color filter layer 150, and a lens layer 160.

The semiconductor layer 101 has a front surface 102 and a back surface 103 opposite to the front surface 102. The unit cells 125 are disposed in the semiconductor layer 101. Each unit cell 125 includes at least a photoelectric conversion element PD. In the present embodiment, each unit cell 125 is configured as a CMOS sensor and includes at least a photoelectric conversion element PD and a transistor TR. The transistor TR is, for example, an N-type MOS transistor. The transistor TR is also called a transfer transistor. The transistor TR includes a gate electrode 133 and N-type semiconductor regions 134 and 135 serving as a source or drain region. The semiconductor region 134 constitutes the photoelectric conversion element PD. The N-type semiconductor region 134 and a P-type semiconductor region 137 form a PN junction. An element isolation part 136 is disposed, for example, between elements. The element isolation part 136 has, for example, an STI structure (shallow trench isolation structure). The gate electrode 133 of the transistor TR and the element isolation part 136 are located on the front surface 102.

The plurality of wiring layers 130, the interlayer insulating film 132, and the wiring layer 130*d* are disposed between the front surface 102 of the semiconductor layer 101 and the connection plane 200. The plurality of wiring layers 130 include a wiring layer 130*a*, a wiring layer 130*b*, a wiring layer 130*c*, and a wiring layer 130*d* which are located in this order from the front surface 102 toward the connection plane 200. The wiring layer 130*a*, the wiring layer 130*b*, the wiring layer 130*c*, and the wiring layer 130*d* are located at different positions as seen from the front surface 102 such that the distance from the front surface 102 to the position of each wiring layer increases in the order described above. Each of the plurality of wiring layers 130 includes a plurality of wirings. The interlayer insulating film 132 is disposed between the plurality of wiring layers 130 and between the plurality of wirings. Reference symbols are not described in the figure for contact plugs and via plugs. The contact plugs and the via plugs are used to make electrical connections between the semiconductor layer 101 and the wirings, between the gate electrodes 133 and the wirings, and between a wiring and another wiring. Wirings, contact plugs and via plugs are made of conductors such as copper, tungsten, aluminum, or the like. The interlayer insulating film 132 is made of, for example, silicon oxide, silicon oxynitride, silicon nitride, or the like. The wiring layer 130*d* is a conductor for making an electrical connection with the second substrate 300, and thus it can be said to be a connection member. The wiring layer 130*d* is made of, for example, copper. The upper surface of the wiring layer 130*d* constitutes the connection plane 200. The first substrate 100 shown in FIG. 2 is merely an example, and the numbers of wiring layers 130, interlayer insulating films 132, and the transistors TR, and connection relationship among them may be appropriately changed. That is, the first substrate 100 may have an arbitrary configuration. The wiring layer 130*d* may be formed of a material using a production method similar to the material and the production method used for the wiring layers 130a, 130b, and 130c.

On the side of the back surface 103 of the semiconductor layer 101, a light shielding layer 140, an insulating film 141, a color filter layer 150, and a lens layer 160 are disposed in the Z direction from the back surface 103. The light shielding layer 140 is disposed between boundaries of unit cells 125, on the peripheral part 121, and on an OB part 123 (optical black part) in the pixel part 120. The light shielding layer 140 is made of a conductor such as aluminum or tungsten. The insulating film 141 is made of a material such as aluminum oxide, hafnium oxide, silicon oxide, silicon oxynitride, silicon nitride, or the like. The color filter layer 150 includes color filters corresponding to a plurality of colors so as to be capable of separating incident light into the plurality of colors. The color filter layer 150 may include a planarization layer at least either between the color filter and the insulating film 141 or between the color filter and the lens layer 160. The lens layer 160 includes a plurality of lenses arranged in a two dimensional array. Each lens is capable of collecting incident light on a corresponding photoelectric conversion element PD. At least one lens is provided for each unit cell 125.

A plurality of photoelectric conversion elements PD may be provided in each unit cell 125.

The semiconductor layer 301 has a front surface 302 and a back surface 303 opposite to the front surface 302. In the semiconductor layer 301, semiconductor elements such as transistors TR constituting processing circuits are disposed. Each transistor TR is, for example, an N-type MOS transistor including a gate electrode 333 and N-type semiconductor regions 334 and 335 serving as a source or drain region. Each transistors TR is disposed, for example, in a P-type semiconductor region. An element isolation part 336 is disposed, for example, between elements. The element isolation part 336 has, for example, an STI structure (shallow trench isolation structure). The gate electrode 333 of the transistor TR and the element isolation part 336 are located on the front surface 302.

A plurality of wiring layers 330, an interlayer insulating film 332, and a wiring layer 330d are disposed between the front surface 302 of the semiconductor layer 301 and the connection plane 200. The plurality of wiring layers 330 include a wiring layer 330a, a wiring layer 330b, a wiring layer 330c, and a wiring layer 330d which are located in this order from the front surface 302 toward the connection plane 200. The wiring layer 330a, the wiring layer 330b, the wiring layer 330c, and the wiring layer 330d are located at different positions as seen from the front surface 302 such that the distance from the front surface 102 to the position of each wiring layer increases in the order described above. Each of the plurality of wiring layers 330 includes a plurality of wirings. The interlayer insulating film 332 is disposed between the plurality of wiring layers 330 and between the plurality of wirings. Reference symbols are not described in the figure for contact plugs and via plugs. The contact plugs and the via plugs are used to make electrical connections between the semiconductor layer 301 and the wirings, between the gate electrodes 333 and the wirings, and between a wiring and another wiring. These are formed in similar manners to those on the first substrate 100, and thus a description thereof in terms of materials and the like is omitted. The wiring layer 330d is a conductor for making an electrical connection with the first substrate 100, and thus it can be said to be a connection member. The wiring layer 330d is made of, for example, copper. The upper surface of the wiring layer 330d constitutes the connection plane 200. The second substrate 300 shown in FIG. 2 is merely an example, and the numbers of wiring layers 330, interlayer insulating films 332, and transistors TR, and connection relationship among them may be appropriately changed. That is, the second substrate 300 can have an arbitrary configuration. The wiring layer 330d can be formed of a material and by a production method similar to the material and the production method used for the wiring layers 330a, 330b, and 330c.

The first substrate 100 and the second substrate 300 are electrically connected to each other via the connection plane 200. It can be said that the connection plane 200 is formed by the upper surface of the first substrate 100 and the upper surface of the second substrate 300. The connection between the first substrate 100 and the second substrate 300 may be realized by at least one of joining between the interlayer insulating film 132 and the interlayer insulating film 332 or joining between the wiring layer 130d and the wiring layer 330d. The connection plane 200 is formed as a result of joining. The first connection parts 250 each include the wiring layer 130d and the wiring layer 330d. The second connection parts 260 each includes the wiring layer 130d and the wiring layer 330d.

Each pad part 110 includes a pad 115 and an opening 117. The opening 117 penetrates the first substrate 100 and exposes the surface of the pad 115 disposed in the wiring layer 330c of the second substrate 300. Inside the opening 117, a conductor 116 for making an electrical connection with an external apparatus may be disposed. In the specific example shown in FIG. 2, the conductor 116 is a conductor wire. However, the conductor 116 may be a through electrode (hereinafter referred to as TSV (Through Silicon Via) or the like.

Next, the configurations of the first signal processing unit 310 and the second signal processing unit 320 are described below with reference to FIGS. 1 and 2. The first signal processing unit 310 includes a first wiring structure 350 and a first connection area 251, and the second signal processing unit 320 includes a second wiring structure 360 and a second connection area 261. The first wiring structure 350 and the second wiring structure 360 each are formed by a plurality of wiring layers 330. The plurality of first connection parts 250 disposed in the first connection area 251 are used for transmitting signals to/from the first signal processing unit 310 and supplying power supply voltages to the first signal processing unit 310. The plurality of second connection parts 260 disposed in the second connection area 261 are used for transmitting signals to/from the second signal processing unit 320 and supplying power supply voltages to the second signal processing unit 320.

A method of supplying power supply voltages is described in detail below with reference to FIG. 15 in addition to FIGS. 1 and 2. As shown in FIG. 15, one or more power supply voltages are supplied to each block. A power supply voltage Vp1a and a power supply voltage Vp1b are supplied to the first signal processing unit 310. A power supply voltage Vp2a and a power supply voltage Vp2b are supplied to the second signal processing unit 320. A power supply voltage Vpixa and a power supply voltage Vpixb are supplied to the pixel part 120. A power supply voltage Vvs is supplied to the scanning circuit 370, a power supply voltage Vtg is supplied to the drive circuit 380, and a power supply voltage Vout is supplied to the output circuit 390. Power supply voltages are supplied via two paths to the first signal processing unit 310, the second signal processing unit 320, and the pixel part 120, that is, power supply voltages are supplied by two power supply systems. However, one power supply system or three or more power supply systems may be used. The scanning circuit 370, the drive circuit 380, and the output circuit 390 may also be supplied with an arbitrary number of power supply voltages. The voltage values supplied from a plurality of power supply systems to the same one circuit block may be equal to each other or may be different from each other. For example, power supply voltages of 1.8 V and 1.2 V may be supplied to the first signal processing unit 310. The voltage value is also called a voltage level. Hereinafter, a path of a power supply voltage is also referred to as a power supply system.

Most of the power supply voltages are supplied from the outside via the pad part 110 shown in FIG. 1. One power supply voltage may be supplied via one pad 115. In a case where it is needed to supply high power to a circuit or a path, one power supply voltage may be supplied via a plurality of pads 115. A power generation unit may be provided inside the photoelectric conversion apparatus 1, and a desired power supply voltage may be generated and supplied by this power generation unit. Note that the power supply voltages may indicate voltage values as they are input from the outside, or may indicate voltage values obtained as a result of being transformed by internal circuits such as power generation units. The voltage values may be positive or negative. The power supply voltages include a ground voltage GND.

Voltage fluctuations and heat generation in the second signal processing unit 320 are described below with reference to FIGS. 1, 2, 12, and 15. The second signal processing unit 320 executes processing based on the neural network calculation model on the input image signal applied as described above. In the processing based on the neural network calculation model, in general, a complicated computation process is performed at a high speed, and therefore a large amount of power is consumed. In the power supply systems for supplying power to the second signal processing unit 320 which consumes a large amount of power, voltage fluctuations caused by voltage drops may occur depending on the power consumption. The large power consumption causes a large amount of heat generation to occur in the second signal processing unit 320.

The voltage fluctuation is further described below. When the voltage of the power supply system fluctuates, an unintentional malfunction may occur in the operation of a circuit block to which power is supplied via the same power supply system. When a fluctuation occurs in a voltage of a power supply system, this fluctuation can cause a voltage of another wiring to fluctuate via capacitive coupling, which may cause an unintentional malfunction to occur in an operation of a circuit block, such as a deviation of a pixel signal from its correct value. Examples of unintentional malfunctions include a malfunction of the amplification operation, a malfunction of an AD converter, and so on. More specifically, in the case of the photoelectric conversion apparatus 1, a reduction in the image quality, a reduction in accuracy in the distance information, and the like may occur.

Generation of heat is described below. As shown in FIG. 1, the second signal processing unit 320 is disposed on the second substrate 300. When heat is generated in the second signal processing unit 320 on the second substrate 300, the heat propagates via the connection plane 200 to the side where the first substrate 100 is disposed. Furthermore, heat generated in the second signal processing unit 320 on the second board 300 propagates to part of the second substrate 300 via wirings. Heat can cause an increase in a noise signal such as a dark current in the unit cell 125 on the first substrate 100. Furthermore, heat may cause an increase in a noise signal in the first signal processing unit 310 and/or the like.

An in-plane distribution of heat generation is described below. The in-plane distribution is a distribution in an XY plane such as that shown in FIG. 1. In a case where heat is generation non-uniformly in the second signal processing unit 320, non-uniform influences of the heat generation occur in the pixel part 120, in the plane of the first substrate 100, and in circuit blocks such as the first signal processing unit 310. Even in a case where heat is generated uniformly in the second signal processing unit 320, if heat conduction is non-uniform, or/and depending on positional relationships with respect to the second signal processing unit 320 such as that shown in FIG. 1, non-uniform influences of heat can occur.

An influence of non-uniform heat generation (temperature unevenness) may result in in-plane non-uniformity (in-plane unevenness) of noise signals. The in-plane unevenness of the noise signal may cause degradation of the image quality. A change in the heat generation can occur depending on the image capturing environment, image capturing conditions, and signal processing conditions. That is, the influence of heat generation is not regular, and thus a compensation for the influence of heat generation is difficult. For example, when a reference signal obtained in the OB part 123 shown in FIG. 2 at a particular timing or a reference signal based on a pixel signal is held, if an increase occurs in noise signal due to an influence of heat generation, it is difficult to determine an accurate correlation of a pixel signal obtained in such a state in which there is increased noise with the reference signal.

To handle above situation, power supply systems are configured such that different power supply systems are used at least for the second signal processing unit 320 and the first signal processing unit 310. For example, in FIG. 15, it is assumed that the power supply voltage Vp1$a$ is 3.3 V, the power supply voltage Vp1$b$ is 1.2 V, the power supply voltage Vp2$a$ is 1.2 V, and the power supply voltage Vp2$b$ is 1.2 V. Although the first signal processing unit 310 and the second signal processing unit 320 are supplied with power supply voltages equal to 1.2 V, the power supply voltage Vp2$a$ and the power supply voltage Vp2$b$ are supplied via power supply systems different at least from a power supply system of the power supply voltage Vp1$b$. In the present embodiment, the power supply voltage Vp2$a$, the power supply voltage Vp2$b$, and the power supply voltage Vp1$b$ are all supplied via different power supply systems.

As described above, the power supply system for the second signal processing unit 320, which tends to have a fluctuation, is separated from the power supply system for the first signal processing unit 310 thereby achieving a reduction in the influence of voltage fluctuation. The first signal processing unit 310 and the second signal processing unit 320 each include a circuit that can be driven at a low voltage. In such a configuration, by providing power supply systems separately for the first signal processing unit 310 and the second signal processing unit 320, it becomes possible that even when high-power processing is performed by the second signal processing unit 320, a suppression is achieved in an influence thereof on the power supply systems for the first signal processing unit 310 which may be located close to the second signal processing unit 320. Note that the term "system" used here indicates a path made of a conductor extending from a pad 115 to a circuit to which a power supply voltage is supplied, or a path from a power generation unit to a circuit to which a voltage is supplied.

The circuit that can be driven at a low voltage includes a circuit realized using a transistor produced by a fine process. The transistor produced by the fine process is a transistor produced according to a finer process rule than a conventional process rule. More specifically, for example, the transistor formed by the fine process has a smaller gate electrode length (gate length) and a gate electrode width (gate width) than those of a transistor formed by the conventional process rule. Furthermore, a gate insulating film of the transistor formed by the fine process is thinner than that of the transistor formed by the conventional process rule.

By providing the power supply systems separately for the second signal processing unit 320 and for the first signal processing unit 310, it becomes possible to reduce the influence of heat generation on the first signal processing unit 310 via wirings.

The wirings of the second signal processing unit 320 are described below with reference to FIG. 2. In the photoelectric conversion apparatus 1, the wirings of the wiring structure 360 are disposed more densely than the wirings of the wiring structure 350. As described above, the second signal processing unit 320 may generate a large amount of heat. Thus, by configuring the wirings of the wiring structures 350 and 360 in the above-described manner, it becomes possible to facilitate exhaustion of heat from the second signal processing unit 320. Furthermore, the increase in the wiring density allows a reduction in the impedance of the wirings. The low impedance of the wiring results in a reduction in the effects of voltage fluctuations. In one embodiment, the wiring density is high in particular for main wirings via which large currents flow, such as wirings via which power supply voltages are supplied. By forming the wiring structure 360 to have a high wiring density as described above, it is possible to reduce at least one of the influences of voltage fluctuation and the influences of heat generation.

More specifically, the high wiring density can be achieved, for example, as follows. For example, the wiring structures are formed such that the volume of the wirings of the wiring structure 360 of the second signal processing unit 320 is larger than the volume of the wirings of the wiring structure 350 of the first signal processing unit 310. For example, the wiring structures are formed such that the wiring area of the wiring structure 360 of the second signal processing unit 320 is larger than the wiring area of the wiring structure 350 of the first signal processing unit 310. Note that the volume of the wirings and the area of the wirings are represented by values per unit area of the second signal processing unit 320 or per unit area of the first signal processing unit 310. That is, the wiring area per unit area can be said as a ratio of the wiring area to the area of a processing unit or a circuit.

Figure 12A:
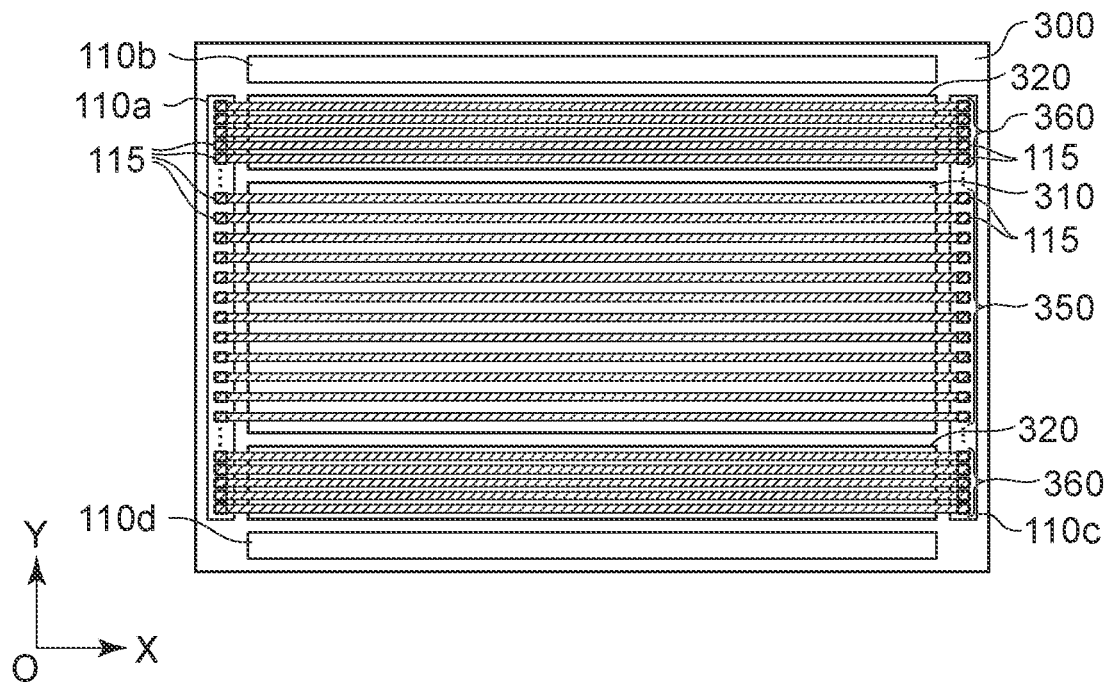
FIGS. 12A to 12D each are a schematic plan view of a wiring configuration of a photoelectric conversion apparatus.

The wiring structure of the second substrate 300 is described below with reference to FIG. 12A. FIG. 12A is a schematic plan view of the wiring configuration of the photoelectric conversion apparatus 1 according to the present embodiment. More specifically, FIG. 12A illustrates the wirings of the first wiring structure 350 formed for the first signal processing unit 310 and the wirings of the second wiring structure 360 formed for the second signal processing unit 320. In FIG. 12A, twelve wirings are shown for the first wiring structure 350, and five wirings are shown for each of the plurality of second wirings. Here, for convenience of explanation, the four pad parts 110 are respectively referred to as pad parts 110a to 110d.

The pad part 110a and the pad part 110c are formed so as to extend in the Y direction, and the pad part 110b and the pad part 110d are formed so as to extend in the X direction.

The pad part 110a and the pad part 110c each have a long side along the Y direction, and the pad part 110b and the pad part 110d each have a long side along the X direction. The first signal processing unit 310 and the second signal processing unit 320 are located between the pad part 110a and the pad part 110c. Each of the wirings of the first wiring structure 350 is electrically connected to one pad 115 of the pad part 110a and also electrically connected to one pad 115 of the pad part 110c. That is, each wiring of the first wiring structure 350 extends from one pad 115 of the pad part 110a to one pad 115 of the pad part 110c. Each of the wirings of the second wiring structure 360 is electrically connected to one pad 115 of the pad part 110a and also electrically connected to one pad 115 of the pad part 110c. That is, each wiring of the second wiring structure 360 extends from one pad 115 of the pad part 110a to one pad 115 of the pad part 110c.

As described above, the wirings of the first wiring structure 350 are for supplying voltages to the first signal processing unit 310, and they are not connected to any element of the second signal processing unit 320 and not located on the second signal processing unit 320. The wirings of the second wiring structure 360 are for supplying voltages to the second signal processing unit 320, and they are not connected to any element of the first signal processing unit 310 and not located on the first signal processing unit 310. The configuration described above makes it possible to reduce the influences of the voltage fluctuation and the influences of heat generation.

Next, the wiring density on the second substrate 300 is described below. The width of each wiring of the first wiring structure 350 is substantially equal to the width of each wiring of the second wiring structure 360. However, the wiring interval of the wirings of the first wiring structure 350 is larger than the wiring interval of the wirings of the second wiring structure 360. The wiring density of the wirings of the second wiring structure 360 is higher than the wiring density of the wirings of the first wiring structure 350. That is, the density of the wirings on the second signal processing unit 320 is higher than that of the wirings on the first signal processing unit 310. The configuration described above makes it possible to reduce the influences of the voltage fluctuation and the influences of heat generation. The wiring width and wiring interval may also be referred to as line and space. The wiring width, the wiring interval, and the wiring density can be calculated from the plan design drawing of the photoelectric conversion apparatus 1. These values can also be calculated from an image of a cross section or plane of the photoelectric conversion apparatus 1 captured using a scanning electron microscope (SEM) or the like. The wiring density may be a two-dimensional density calculated in a certain plane surface, or may be a three-dimensional density over a plurality of wiring layers provided on the surface of a semiconductor layer. From the viewpoint of the influence of heat generation, it is to adjust the wiring density at a position close to the surface of the semiconductor layer. Hereinafter, the wiring width of the wiring structure, the wiring interval of the wiring structure, and the wiring density of the wiring structure will be simply referred to the wiring width, the wiring interval, and the wiring density, respectively.

The length or the area of a portion, close to the pad part 110, of the second signal processing unit 320, is greater than the length or the area of a portion, close to the pad part 110, of the first signal processing unit 310.

The second signal processing units 320 are located between the pad part 110a and the pad part 110c and between the pad part 110b and the pad part 110d. Three sides of each of the second signal processing units 320 are located along one of the pad parts 110a to 110d. The first signal processing unit 310 is located between the pad part 110a and the pad part 110c and between the two second signal processing units 320. Two sides of the first signal processing unit 310 are located along the pad part 110. In the configuration described above, the second signal processing units 320 have a large number of paths to the pad 115 via which heat is transferred to the outside, which results in an increase in heat dissipation efficiency. By increasing the number of connected pads 115 per unit area, it is possible to reduce the influence of heat generation and the influence of voltage fluctuation.

Figure 12B:
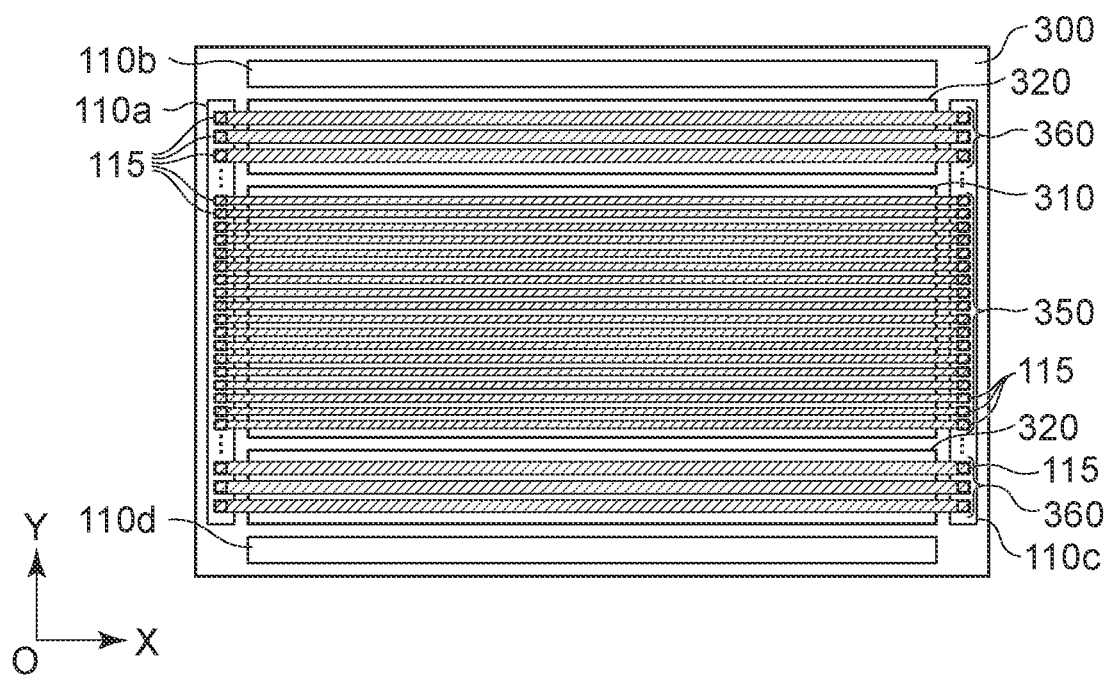

Next, a modification of the configuration shown in FIG. 12A is described. FIG. 12B is a schematic plan view, like FIG. 12A, illustrating the wirings on the second substrate 300. The wiring width of the second wiring structure 360 is larger than the wiring width of the first wiring structure 350. The wiring interval of the second wiring structure 360 is equal to the wiring interval of the first wiring structure 350. The wiring density can be increased by reducing the wiring interval without changing the wiring width as shown in FIG. 12A, or by increasing the wiring width without changing the wiring interval as shown in FIG. 12B.

FIG. 14A is a schematic plan view showing, in more detail, the wiring structure shown in FIG. 12A. FIG. 14B is a schematic plan view showing, in more detail, the wiring structure shown in FIG. 12B. In FIGS. 14A and 14B, a portion where each wiring is connected to a pad 115 is shown in an enlarged manner. In FIG. 14A, each wiring of the first wiring structure 350 has a width W350a and a space S350a.

Each wiring of the second wiring structure 360 has a width W360a and a space S360a. The width W350a and the width W360a are equal to each other. The space S350a is larger than the space S360a. In FIG. 14B, each wiring of the first wiring structure 350 has a width W350b and a space S350b. Each wiring of the second wiring structure 360 has a width W360b and a space S360b. The space S350b and the width S360b are equal to each other. The space W360b is larger than the space Width W350b. The wiring structure is not limited to those described above, and relationships between the wiring space and the wiring width may be combined.

If the wiring density is increased in the entire area, for example, in both the first signal processing unit 310 and the second signal processing unit 320, the following problems may occur. For example, when the distance between adjacent wirings is reduced, a short circuit between the wirings may occur due to a foreign matter during a manufacturing process. For example, when many large-width wirings are provided, dishing is likely to occur in chemical mechanical polishing (CMP), and it may become difficult to achieve good flatness.

Short circuits between wirings and poor flatness can be factors that reduce a manufacturing yield. Therefore, in one embodiment, the wiring density is adjusted according to the positional relationship with the circuit blocks to achieve improvements both in image quality and manufacturing yield. Since the maximum number of pads 115 that can be provided in the photoelectric conversion apparatus 1 is limited, in one embodiment, the number of pads 115 is adjusted depending on the locations of circuits.

By adjusting the configuration as described above, it becomes possible to reduce the influence of the increase in power consumption on the image quality.

In the present embodiment, one first signal processing unit 310 is disposed in the center of the second substrate 300, and tow second signal processing units 320 are disposed such that one is located on the upper side and the other one is located on the lower side of the second substrate 300. However, the layout of circuit blocks is not limited to that described above. For example, the first signal processing unit 310 may be divided into a plurality of parts. The two second signal processing units 320 may be disposed such that one is located on a left or right side and the other is located on the other one of left and right sides. One or both of the two second signal processing units 320 may be further divided. In the configuration shown in FIG. 1, the first signal processing unit 310 and the second signal processing units 320 are all disposed on the second substrate. Alternatively, some circuit elements may be disposed on the first substrate 100. By dividing the circuits, it may become possible to disperse the effects of power supply fluctuations and heat generation.

In the configuration shown in FIG. 12A, all wirings of the first wiring structure 350 and the second wiring structure 360 are connected to the corresponding pads 115, but the connection points between the wirings and the pads 115 may be appropriately modified, for example, such that the connection point density is reduced. Each wiring does not necessarily have to be connected to the pads on both sides.

In the present embodiment, by way of example, the first substrate 100 and the second substrate 300 are combined in the multilayer structure. However, the configuration is not limited to this example. For example, a third substrate may be further provided. In the embodiment described above, by way of example, the first substrate 100 and the second substrate 300 are placed in the multilayer structure such that the front surface 102 of the first substrate 100 and the front surface 302 of the second substrate 300 face each other. However, the front surface 102 of the first substrate 100 and the back surface 303 of the second substrate 300 may face each other, or the back surface 103 of the first substrate 100 and the front surface 302 of the second substrate 300 may face each other. When the multilayer structure is formed, the method of making electrical connections is not limited to bonding, but TSV may be employed.

Second Embodiment

Figure 3:
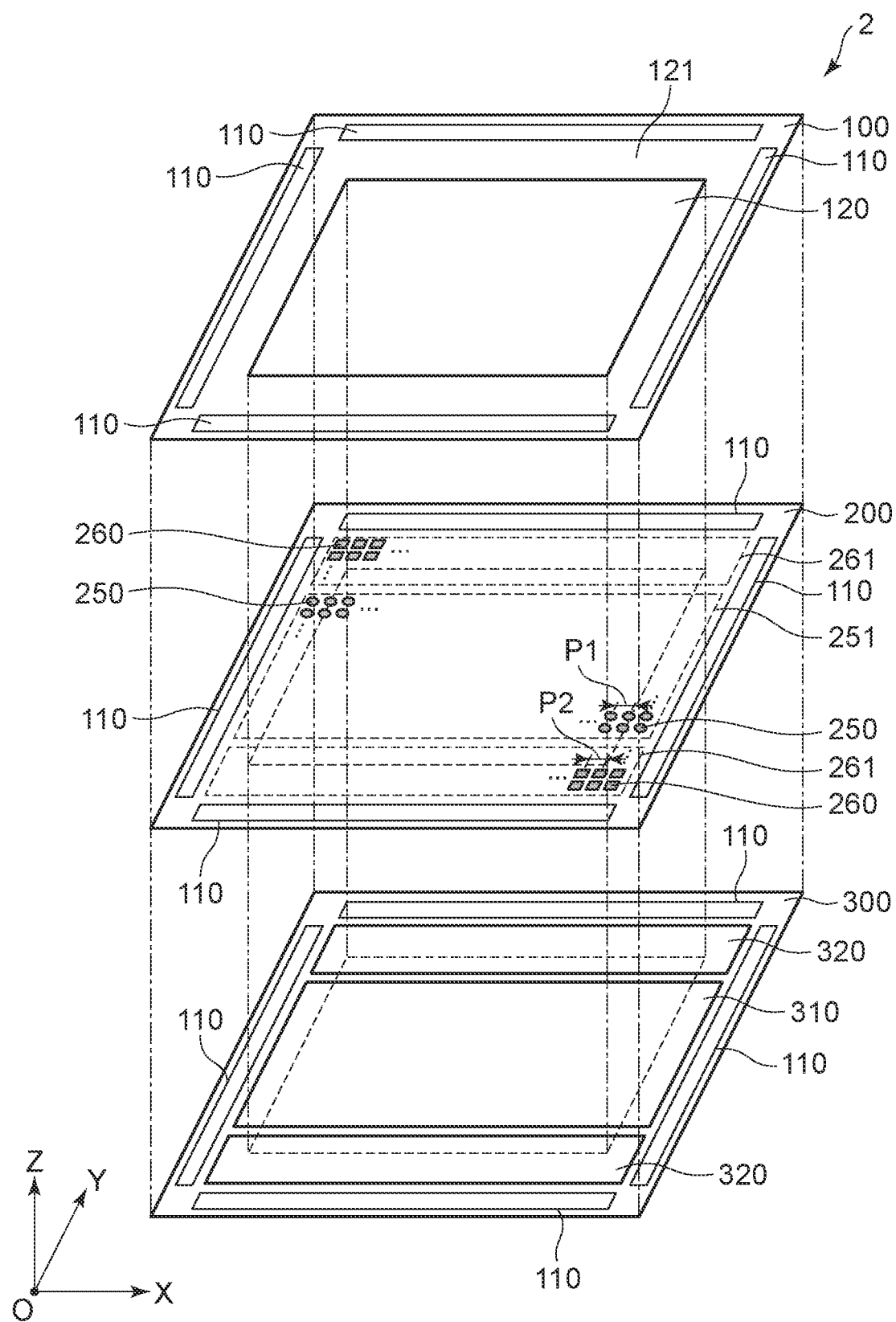
FIG. 3 is a schematic plan view of a photoelectric conversion apparatus according to a second embodiment.

A photoelectric conversion apparatus 2 according to a second embodiment is described below with reference to FIG. 3. The photoelectric conversion apparatus 2 is different from the photoelectric conversion apparatus 1 according to the first embodiment in the configuration of the connection parts on the connection plane 200. FIG. 3 is a schematic plan view of the photoelectric conversion apparatus corresponding to that shown in FIG. 1. In the following description, the same contents as those described in the previous embodiment will not described again.

In the example shown in FIG. 1, the connection parts 250 and the connection parts 260 are rectangular in plan view, and the planar shapes thereof are substantially equal. In contrast, in the configuration shown in FIG. 3, the connection parts 250 are circular in plan view, and the connection parts 260 are rectangular in plan view. That is, the planar shapes are different between the connection parts 250 and the connection parts 260. By employing the configuration described above, it becomes possible to achieve a difference in the wiring densities in the connection plane 200.

Furthermore, in FIG. 3, the interval of the connection parts 250 and the interval of the connection parts 260 are substantially equal. That is, the pitch of the connection parts 250 and the pitch of the connection parts 260 are substantially equal. By forming the connection parts at substantially the same pitch, it is possible to reduce the degradation in flatness which may occur in CMP processing in forming the connection parts. By forming the connection parts at substantially the same pitch, it is also possible to reduce the change in flatness due to heating in forming connection parts. That is, in this configuration, the connection parts are formed such that shapes are different between the connection parts 250 and 260 while maintaining the same pitch, thereby achieving a difference in the density of the connection parts while maintaining the flatness. Since the rectangular shape allows a higher density than the circular shape allows, the connection parts 250 are formed to be circular and the connection parts 260 are formed to be rectangular. As a result, the volume and area of the wiring portion including the connection parts with respect to the second signal processing unit 310 can be further increased, and thus at least one of the effects of heat generation and voltage fluctuation can be reduced. The interval refers to the space between connection parts of the connection parts 250 or the connection parts 260, and the pitch is the periodic distance between adjacent connection parts of the connection parts 250 or 260 that are periodically disposed.

Third Embodiment

Figure 4:
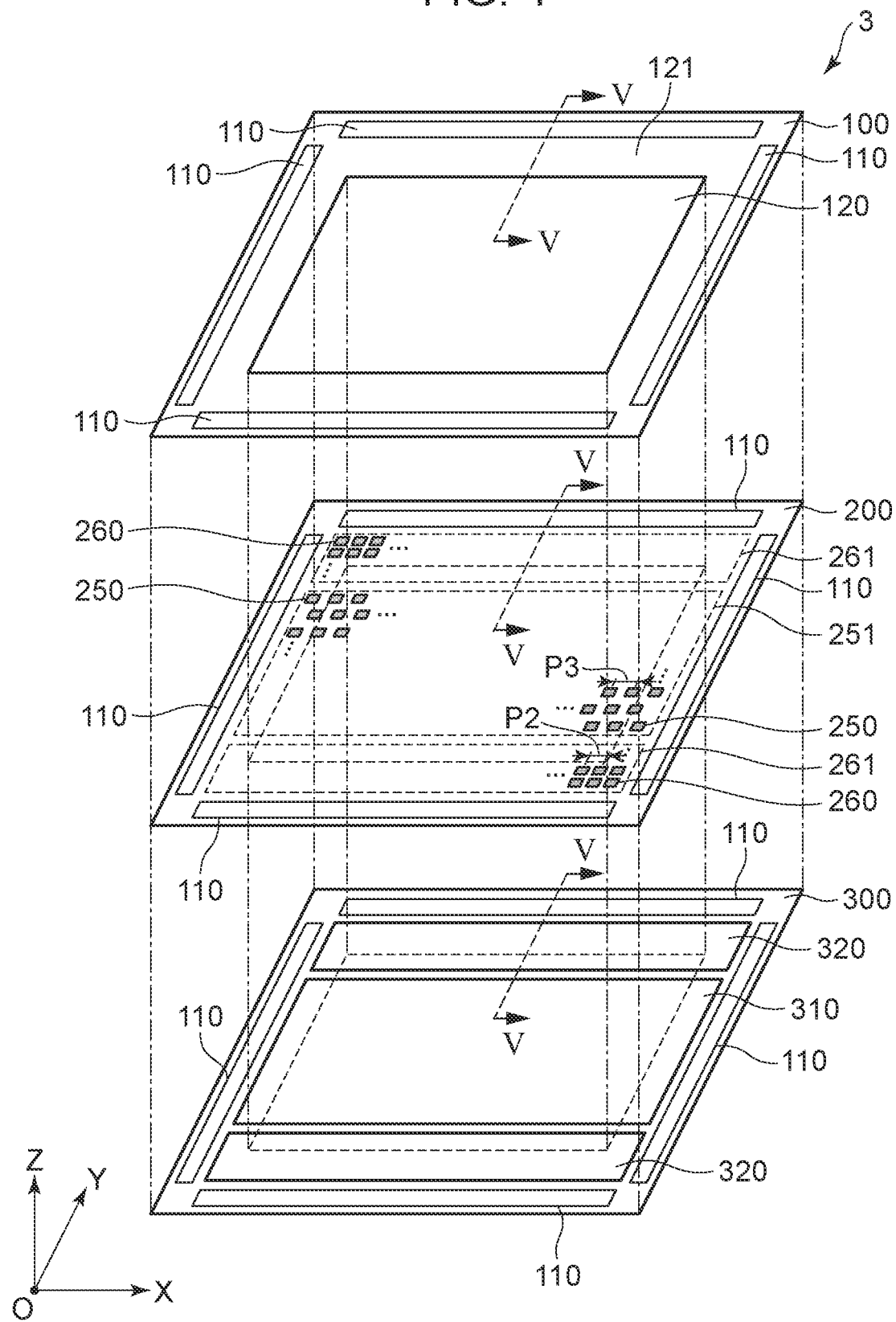
FIG. 4 is a schematic plan view of a photoelectric conversion apparatus according to the second embodiment.
Figure 5:
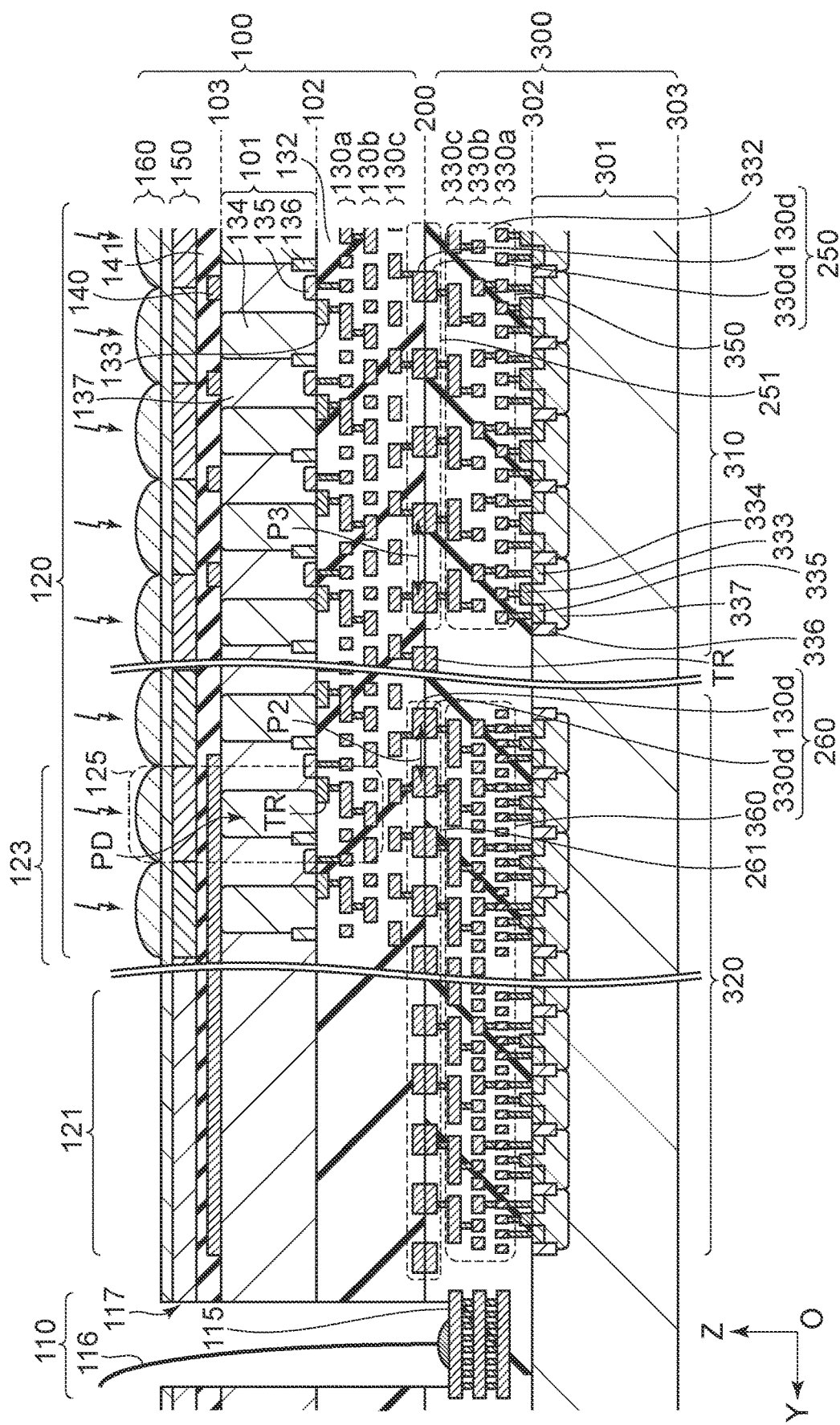
FIG. 5 is a schematic cross-sectional view of the photoelectric conversion apparatus according to the second embodiment.

A photoelectric conversion apparatus 3 according to a third embodiment is described below with reference to FIGS. 4 and 5. The photoelectric conversion apparatus 3 is different from the photoelectric conversion apparatus 1 according to the first embodiment in the configuration of the connection parts in the connection plane 200. FIG. 4 is a schematic plan view, corresponding FIG. 1, showing the photoelectric conversion apparatus 3. FIG. 5 is a schematic cross-sectional view, corresponding to FIG. 2, showing the photoelectric conversion apparatus 3. In the following description, the same contents as those described in the previous embodiment will not described again.

In the first embodiment, as shown in FIGS. 1 and 2, the connection parts 250 are formed at a pitch P1 and the connection parts 260 are formed at a pitch P2. In contrast, in the third embodiment, as shown in FIGS. 4 and 5, the connection parts 250 are formed at a pitch P3, and the connection parts 260 are formed at a pitch P2. Note that the pitch P1 and the pitch P2 are equal to each other, while the pitch P3 is larger than the pitch P2. That is, the width of the space of the plurality of connection parts 250 is larger than the width of the space of the plurality of connection parts 260. As described above, the space may also be called the interval. That is, the wiring density of the connection parts 260 is higher than the wiring density of the connection parts 250. Since the connection member forming the connection parts 250 and the connection parts 260 are part of the wiring layer, the density of the connection parts is also referred to as the wiring density.

Furthermore, the connection parts 250 in FIG. 4 are arranged in directions different from the arrangement directions of the connection parts 250 in FIG. 1. In FIG. 1, the connections parts 250 are arranged in the X and Y directions in the form of a matrix. In contrast, in FIG. 4, the connection parts 250 are arranged in directions respectively rotated by 45 degrees from the X direction and the Y direction in a matrix. Furthermore, the connection parts 250 are arranged such that the locations of the connection parts are shifted by half the pitch P3 between the even-numbered rows and the odd-numbered rows.

In the present embodiment, as described above, the pitch and the arrangement directions of the connection parts 250 and the connection parts 260 of the second signal processing unit are different from those according to the first embodiment. The configuration according to the present embodiment also makes it possible to reduce at least one of the influence of heat generation and the influence of the voltage fluctuation.

Fourth Embodiment

Figure 6:
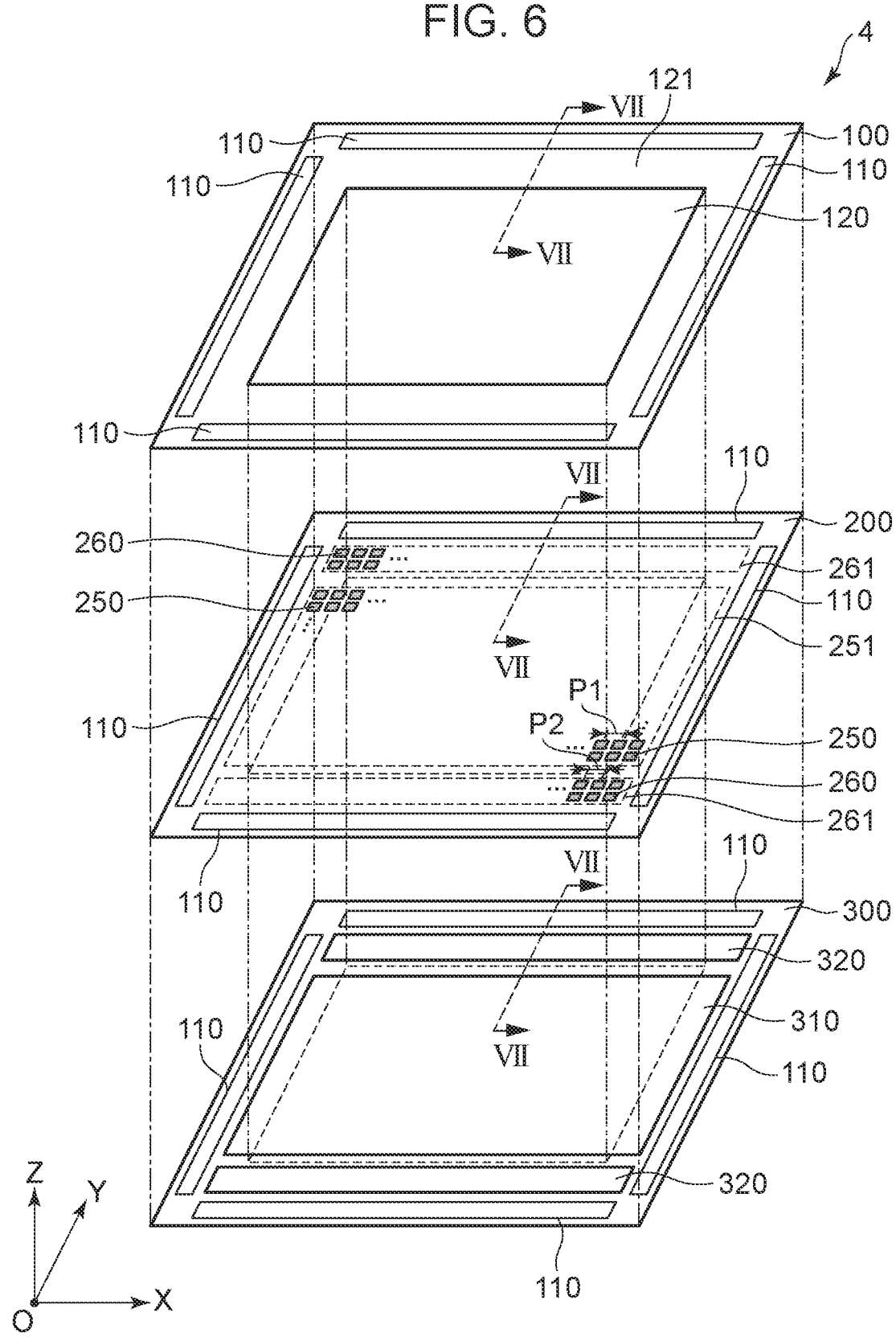
FIG. 6 is a schematic plan view of a photoelectric conversion apparatus according to a fourth embodiment.
Figure 7:
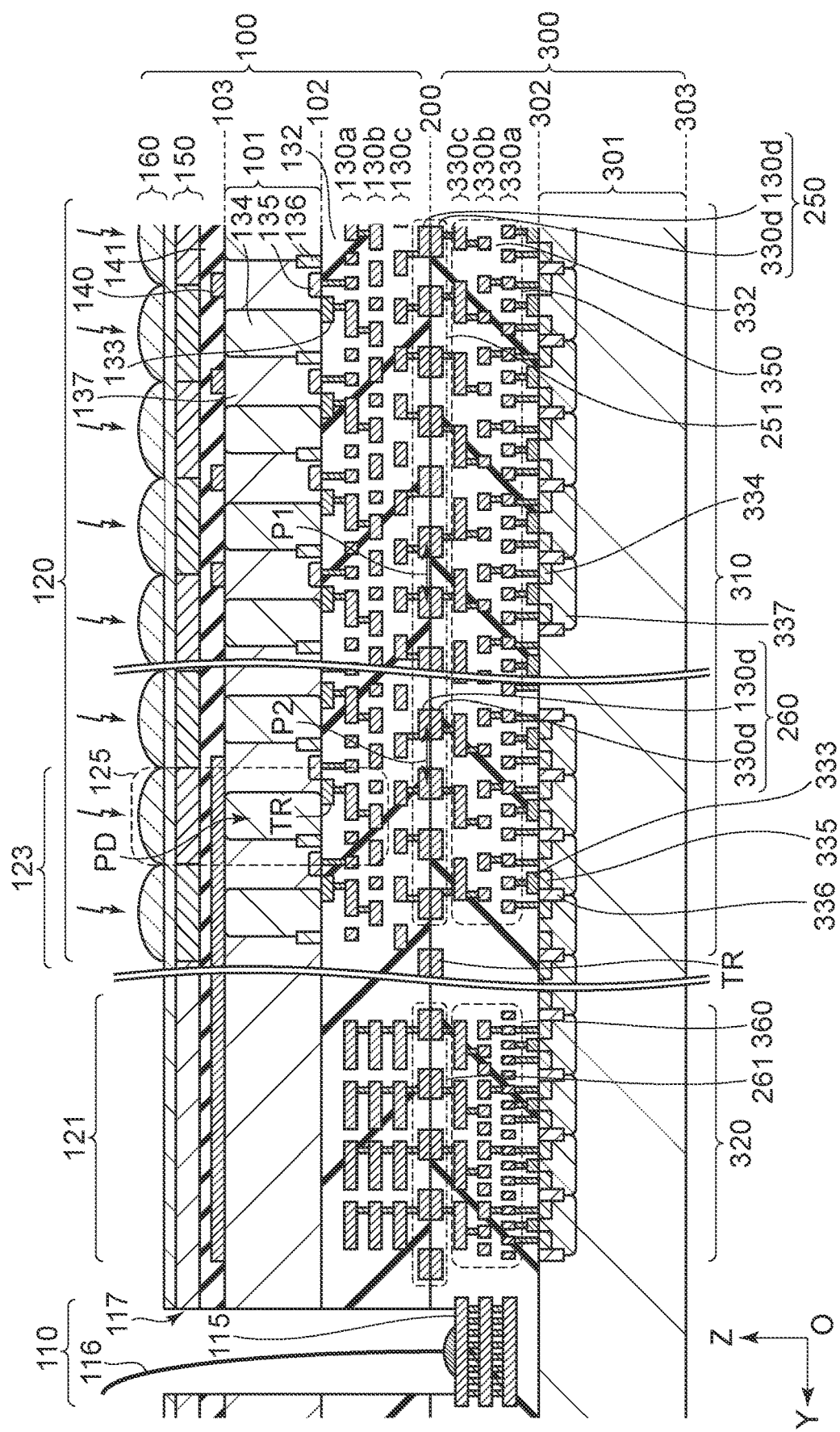
FIG. 7 is a schematic cross-sectional view of the photoelectric conversion apparatus according to the fourth embodiment.

A photoelectric conversion apparatus 4 according to a fourth embodiment is described below with reference to FIGS. 6 and 7. In the following description, the same contents as those described in the previous embodiment will not described again.

In the photoelectric conversion apparatus 4, in contrast to the photoelectric conversion apparatus 1 according to the first embodiment, the second signal processing units 320 are disposed so as not overlap with the pixel part 120. On the second substrate 300, the second signal processing units 320 are disposed in areas other than directly below the pixel part 120 disposed on the first substrate 100. By employing this configuration, it becomes possible to achieve at least one of following effects: reducing the influence of the heat generated in the second signal processing unit 320 on the pixel part 120; and reducing the influence of the voltage fluctuation of the second signal processing units 320 on the pixel part 120.

Fifth Embodiment

A photoelectric conversion apparatus 5 according to a fifth embodiment is described below with reference to FIGS. 8, 9, and 13A.

In the photoelectric conversion apparatus 5, wirings are arranged in a different manner from that in which the wirings are arranged in the photoelectric conversion apparatus 4 according to the fourth embodiment. FIG. 8 is a schematic plan view, corresponding to FIG. 6, showing the photoelectric conversion apparatus 5. FIG. 9 is a schematic cross-sectional view, corresponding to FIG. 7, of the photoelectric conversion apparatus 5. FIG. 13A is a schematic plan view, corresponding to FIG. 12A, showing the wirings of the photoelectric conversion apparatus 5. In the following description, the same contents as those described in the previous embodiment will not described again.

Figure 8:
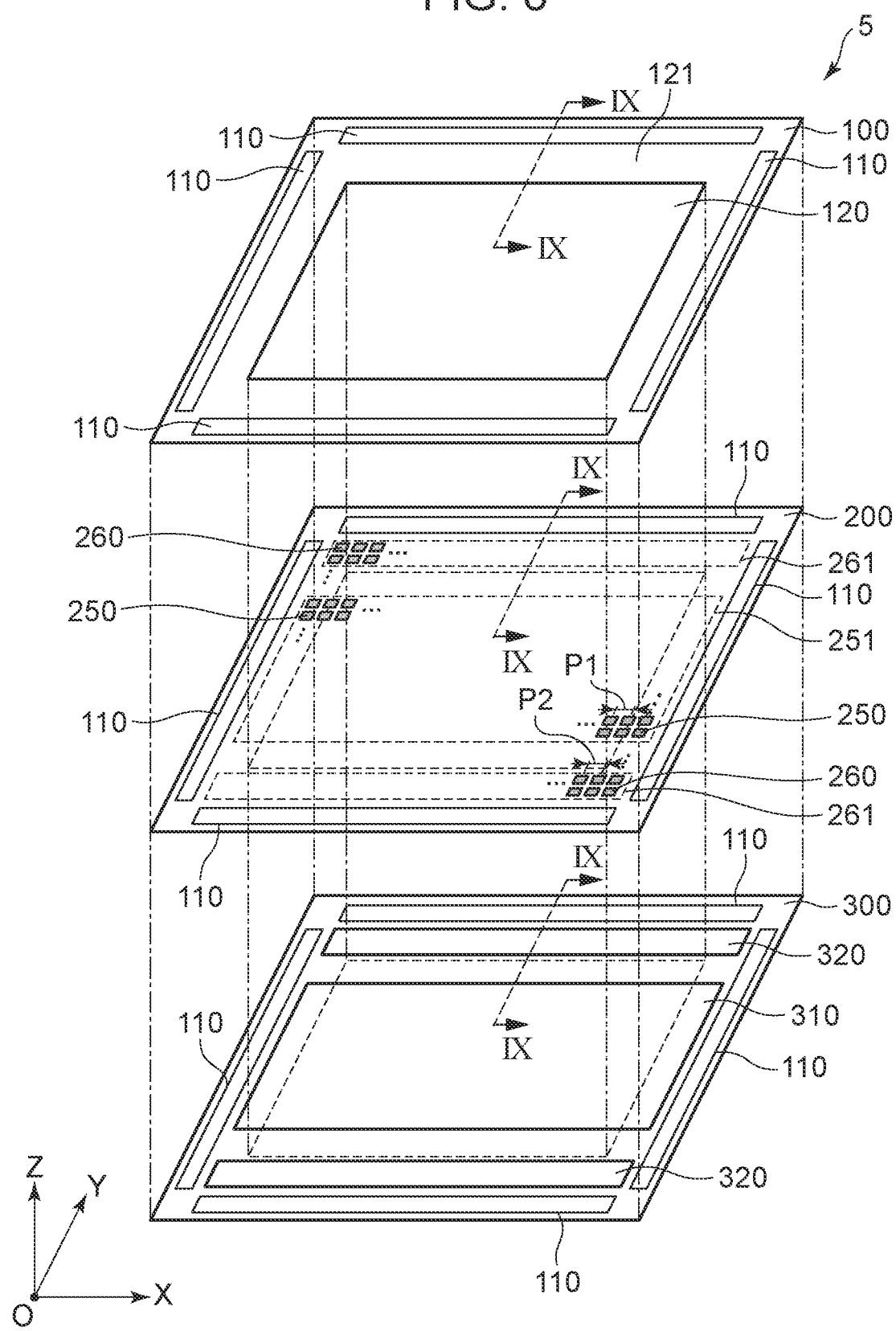
FIG. 8 is a schematic plan view of a photoelectric conversion apparatus according to a fifth embodiment.
Figure 9:
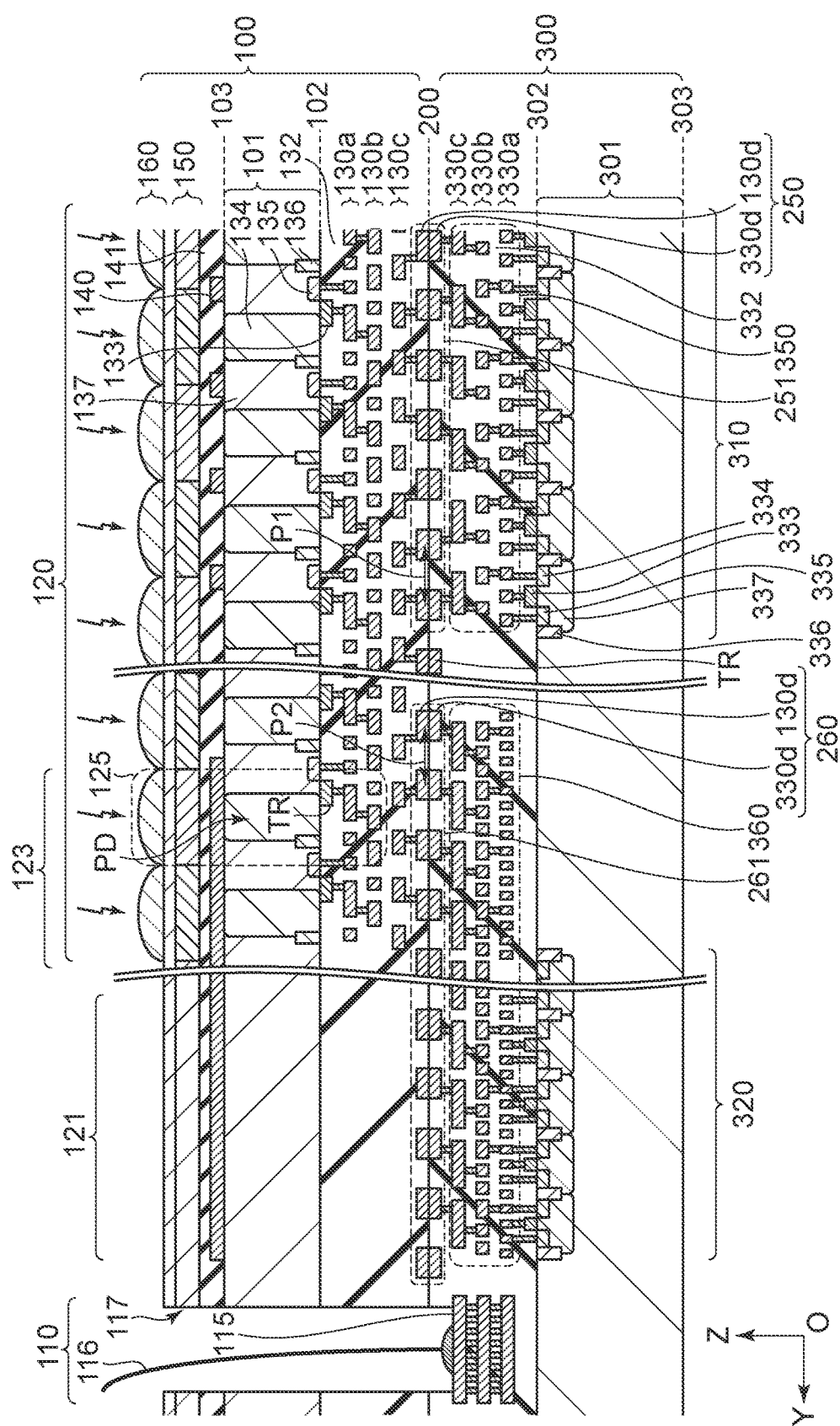
FIG. 9 is a schematic cross-sectional view of a photoelectric conversion apparatus according to the fifth embodiment.

As can be seen from FIGS. 8 and 9, the second signal processing units 320 are disposed so as not to overlap the pixel part 120 when viewed in a plan view. This configuration is similar to that of the photoelectric conversion apparatus 4 shown in FIGS. 6 and 7. In the present embodiment, as shown in FIG. 13A, each wiring structure 360 is disposed over a larger area than the area of each second signal processing unit 320. That is, part of the wirings of each second wiring structure 360 are disposed on the first signal processing unit 310. Furthermore, as shown in FIGS. 8 and 9, the second wiring structures 360 each have a part superimposed on the pixel part 120.

By disposing the second signal processing units 320 in the areas other than directly below the pixel part 120 disposed on the first substrate 100, it is possible to reduce at least one of the influence of heat generation and the influence of voltage fluctuation. By disposing each second wiring structures 360 in a larger area than the area of the corresponding of the second signal processing units 320, it is possible to increase the volume and area of the wiring part on each second signal processing unit 320. Since the wiring density on the second signal processing units 320 can be increased, it is possible to reduce at least one of the influence of heat generation and the influence of voltage fluctuation.

Figure 13A:
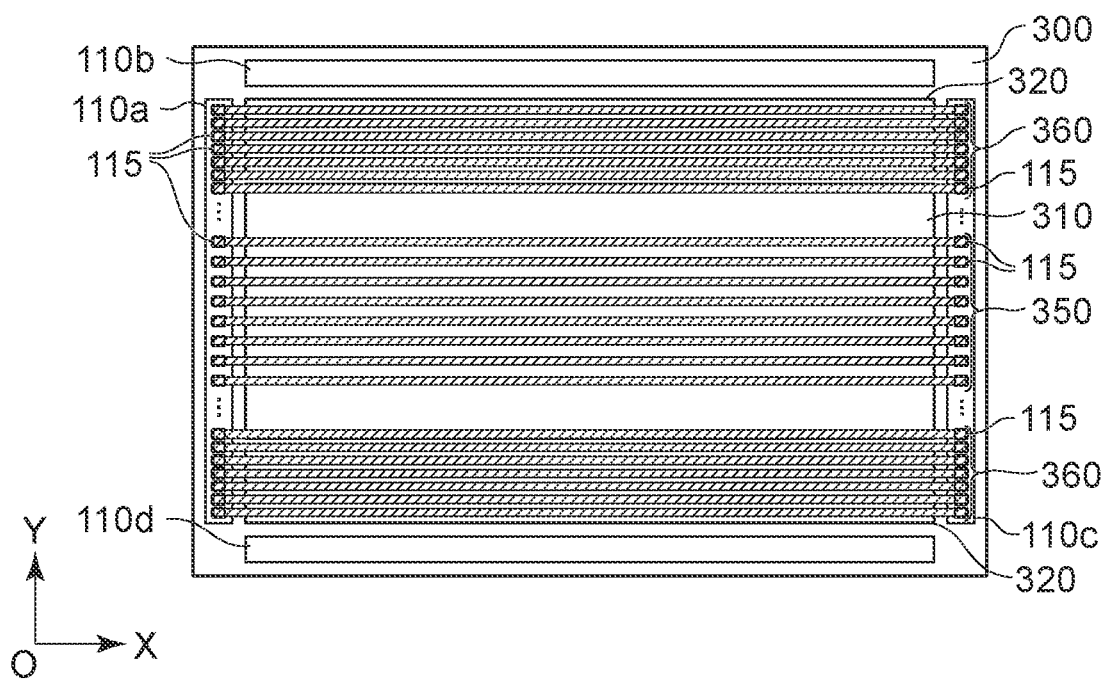
FIGS. 13A to 13D each are a schematic plan view of a wiring configuration of a photoelectric conversion apparatus.
Figure 13B:
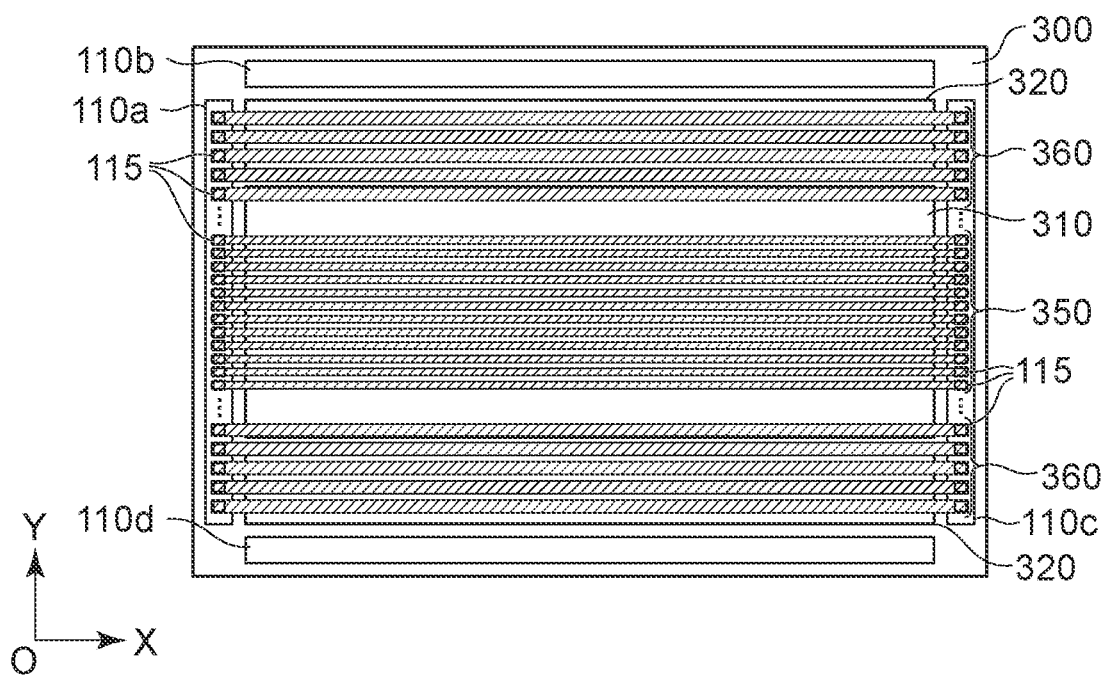

Next, a modification of the configuration shown in FIG. 13A is described. FIG. 13B is a schematic plan view, like FIG. 13A, illustrating the wirings of the second substrate 300. The wiring width of each second wiring structure 360 is larger than the wiring width of the first wiring structure 350. The wiring interval of the second wiring structures 360 is equal to the wiring interval of the first wiring structure 350. The wiring density can be increased by reducing the wiring interval without changing the wiring width as shown in FIG. 13A, or by increasing the wiring width without changing the wiring interval as shown in FIG. 13B. The relationship between FIG. 13A and FIG. 13B is similar to the relationship between FIG. 12A and FIG. 12B, and thus, a further description is omitted.

Sixth Embodiment

Figure 10:
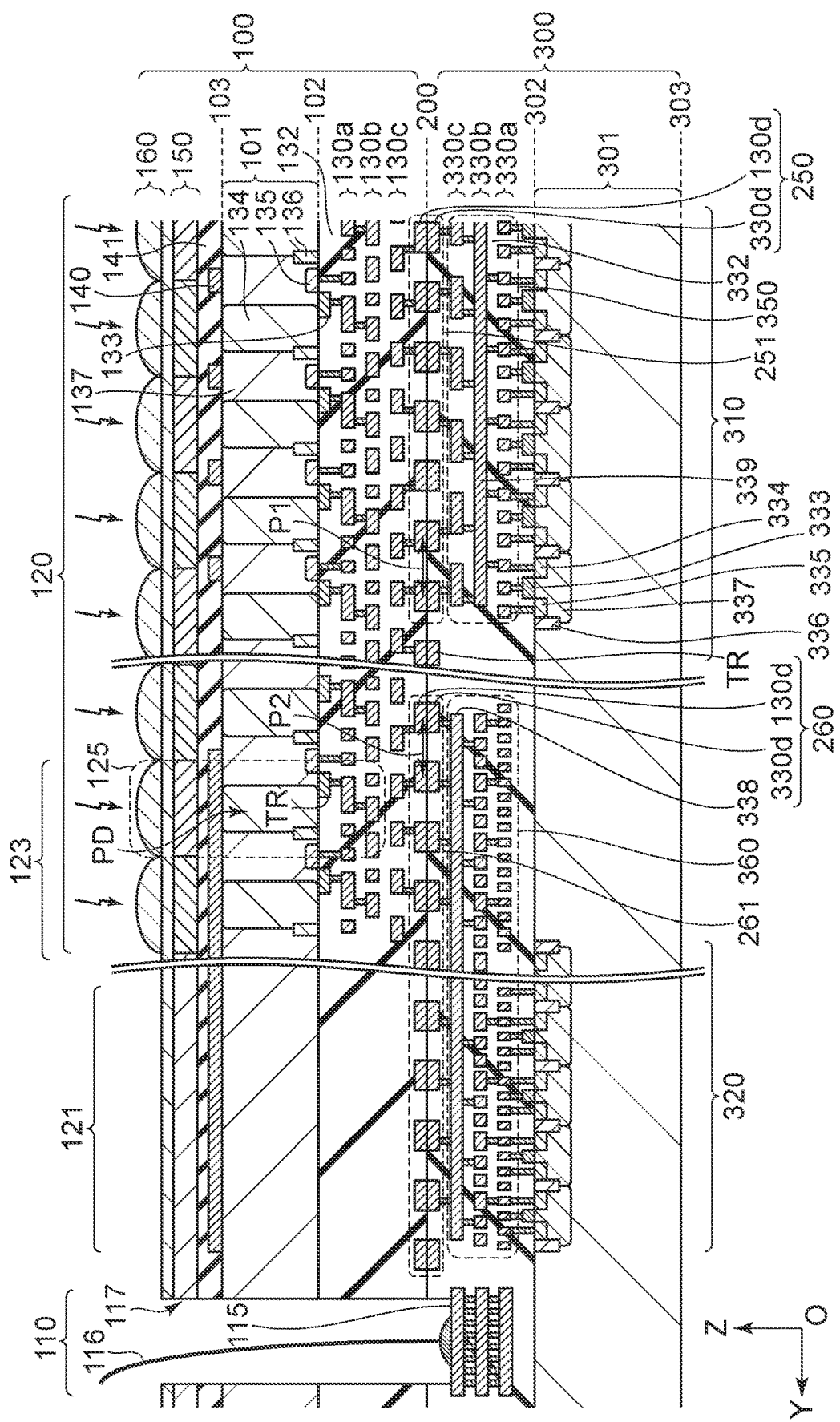
FIG. 10 is a schematic cross-sectional view of a photoelectric conversion apparatus according to a sixth embodiment.
Figure 12C:
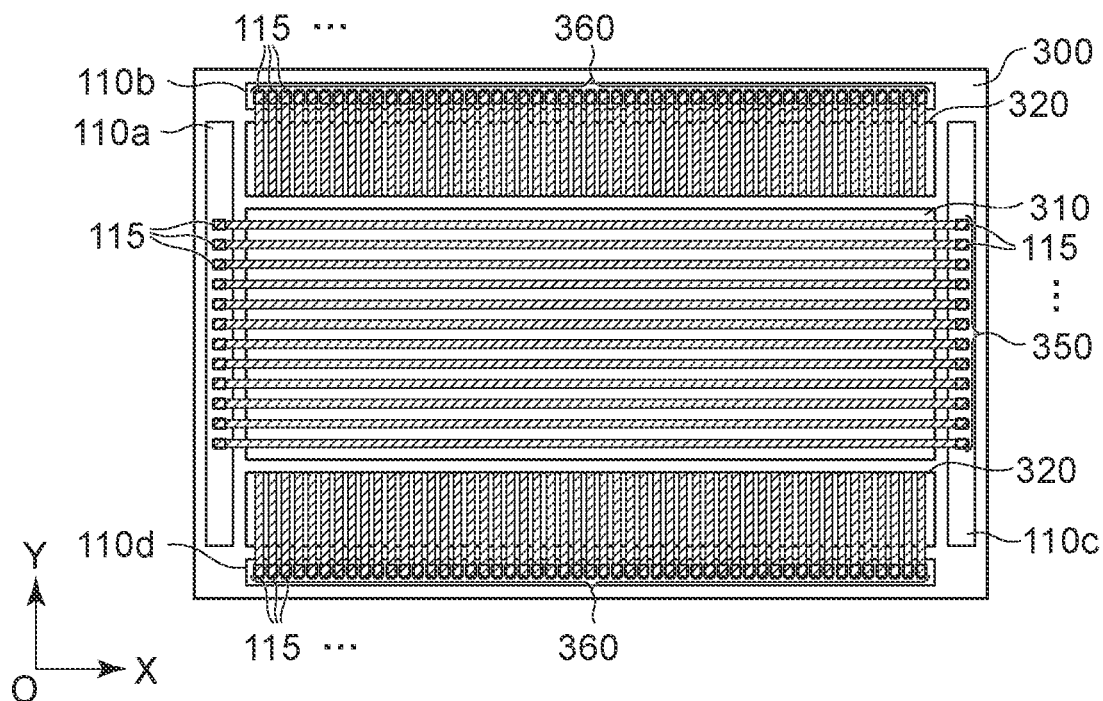

A photoelectric conversion apparatus 6 according to a sixth embodiment is described below with reference to FIGS. 10 and 12C. The photoelectric conversion apparatus 6 is different from the photoelectric conversion apparatus 5 according to the fifth embodiment in that the wirings of the wiring structure 350 extend in a direction different from a direction in which the wirings of the wiring structure 360 extend. FIG. 10 is a schematic cross-sectional view, corresponding to FIG. 9, of the photoelectric conversion apparatus 6. FIG. 12C is a schematic plan view, corresponding to FIG. 12A, showing the photoelectric conversion apparatus 6. In the following description, the same contents as those described in the previous embodiment will not described again.

In FIGS. 10 and 12C, the wirings of the wiring structure 350 extend in the X direction, while the wirings of the wiring structure 360 extend in the Y direction. That is, the longitudinal direction of each wiring of the wiring structure 350 is in the X direction, while the longitudinal direction of each wiring of the wiring structure 360 is in the Y direction. In other words, the principal direction of the wirings of the wiring structure 350 is the X direction, while the principal direction of the wirings of the wiring structure 360 is the Y direction. By forming the wirings so as to extend in different direction as described above, it becomes possible to make connections such that the first signal processing unit 310 and the second signal processing units 320 can be connected via wirings to pads 115 located at closer positions to the first signal processing unit 310 or the second signal processing unit 320. By employing the configuration described above, it is possible to reduce the influence of heat generation and the influence of voltage fluctuation.

Figure 12D:
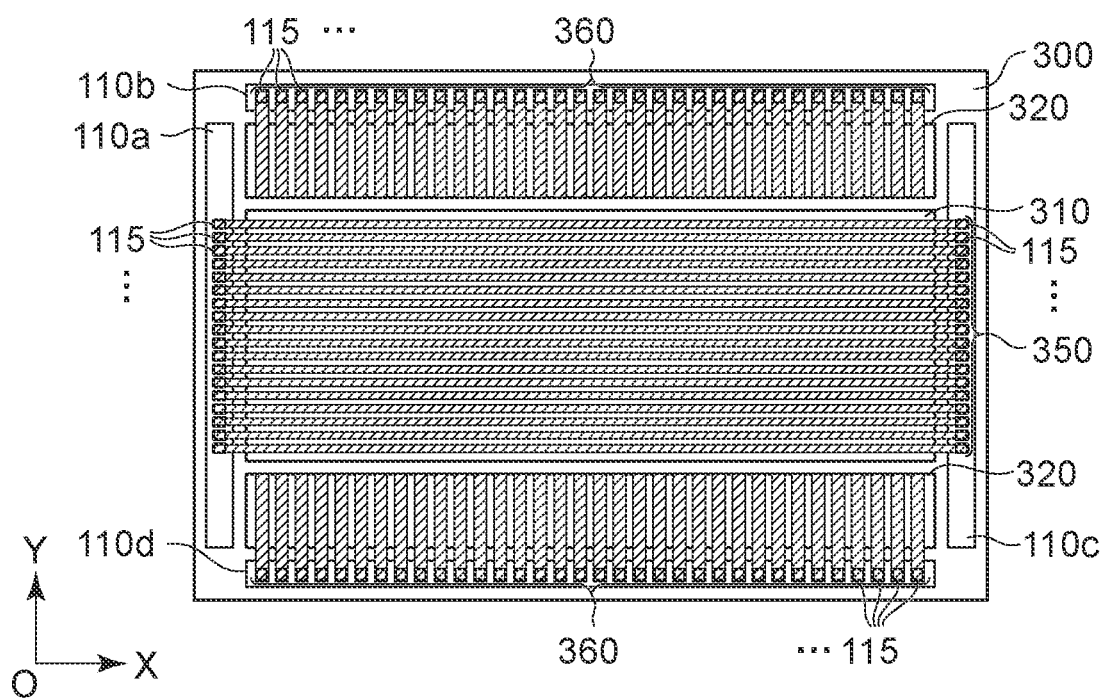

Next, a modification of the configuration shown in FIG. 12C is described. FIG. 12D is a schematic plan view, corresponding to FIG. 12C, showing the photoelectric conversion apparatus. The wiring width of the second wiring structure 360 is larger than the wiring width of the first wiring structure 350. The wiring interval of the second wiring structures 360 is equal to the wiring interval of the first wiring structure 350. The wiring density can be increased by reducing the wiring interval without changing the wiring width as shown in FIG. 12C, or by increasing the wiring width without changing the wiring interval as shown in FIG. 12D. The relationship between FIGS. 12C and 12D is similar to the relationship between FIGS. 12A and 12B, and thus, a further description is omitted.

Figure 13C:
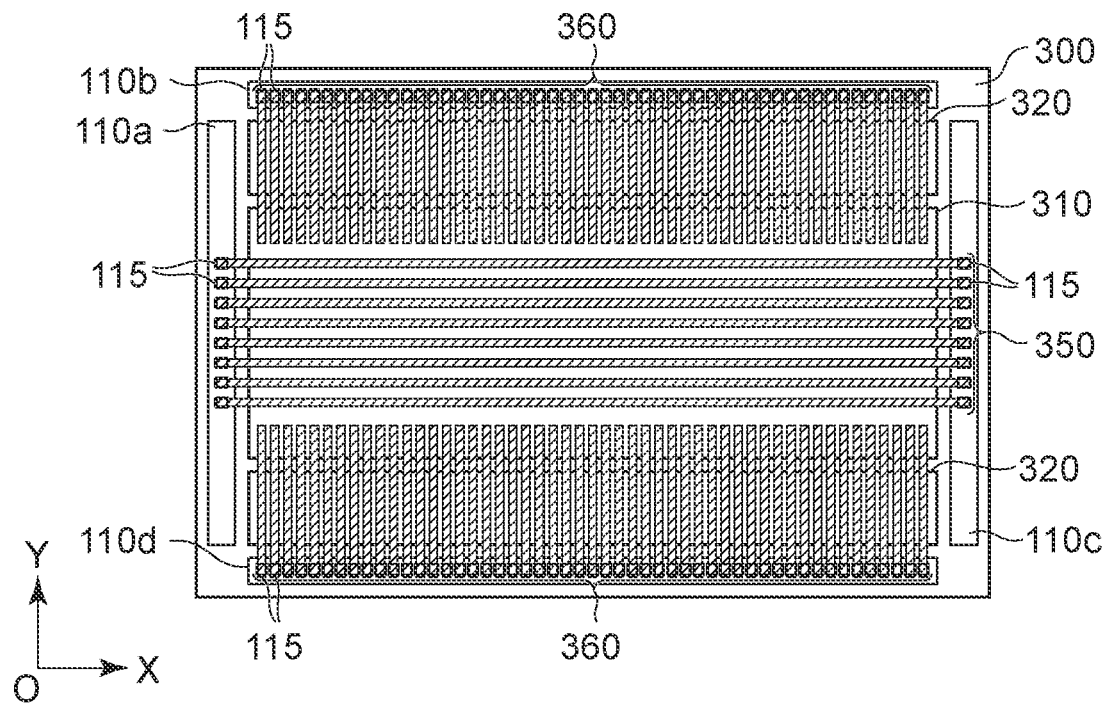
Figure 13D:
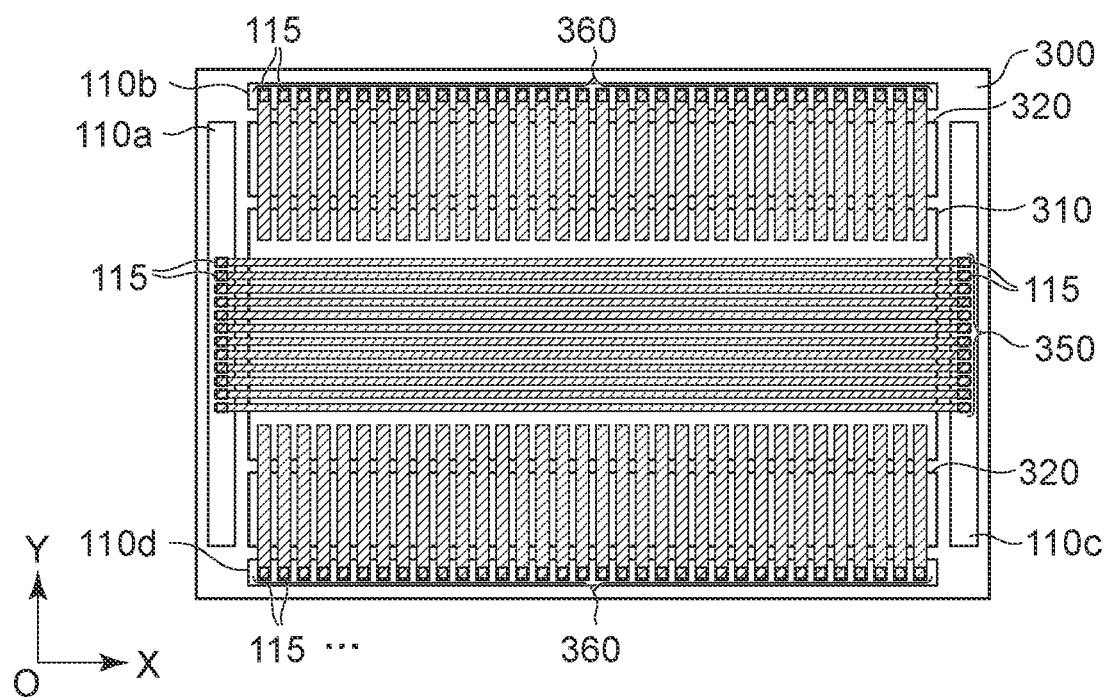

Further examples of modifications of the configuration shown in FIG. 12C and that shown in FIG. 12D are described below. FIG. 13C is a schematic plan view corresponding to FIG. 12C, and FIG. 13D is a schematic plan view corresponding to FIG. 12D. The wirings of each second wiring structure 360 extend such that part thereof extend on the first signal processing unit 310. The configuration described above makes it possible to reduce the influences of the heat generated by the second signal processing unit 320.

As shown in FIG. 10, the principal direction of the wiring may be different depending on the wiring layer. The wiring density of the wiring structure 350 of the first signal processing unit 310 and the wiring density of the wiring structures 360 of the second signal processing units 320 may be different depending on the wiring layer. In one embodiment, the volume and area of the wiring portion are configured as a whole for the second signal processing units 320 are larger and denser.

Figure 11:
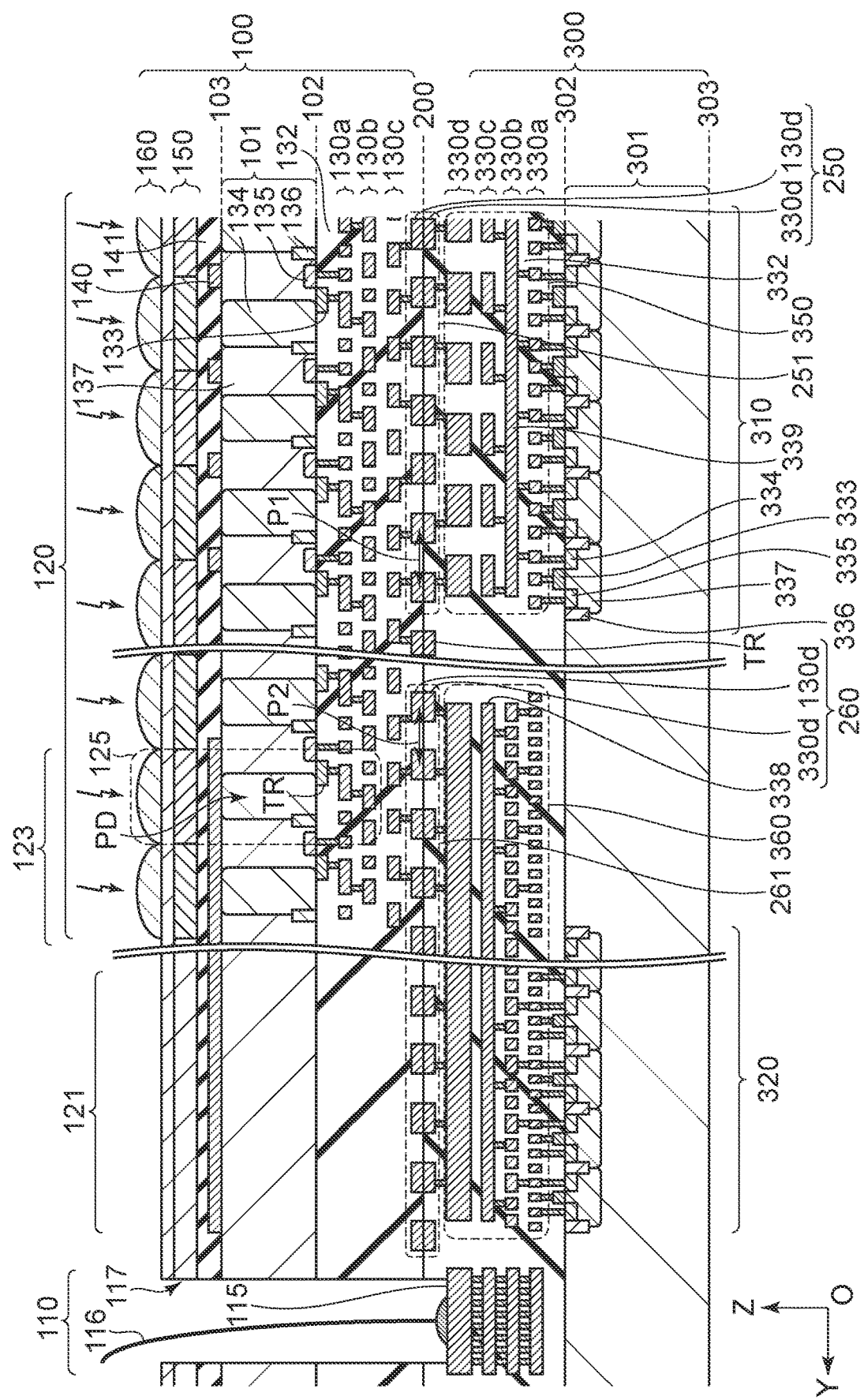
FIG. 11 is a schematic cross-sectional view of a photoelectric conversion apparatus according to the sixth embodiment.

Next, a modification of the configuration shown in FIG. 10 is described. FIG. 11 is a schematic cross-sectional view, corresponding to FIG. 10, of the photoelectric conversion apparatus. Thicknesses of a plurality of wiring layers 330 may be determined such that the thickness is larger for a wiring layer located at a position farther from the semiconductor layer 301 than for a wiring layer at a position closer to the semiconductor layer 301. The wiring density may be increased by assigning the wirings provided at a position farther from the semiconductor layer 301 to the main wirings of the second signal processing units 310.

Seventh Embodiment

Figure 16:
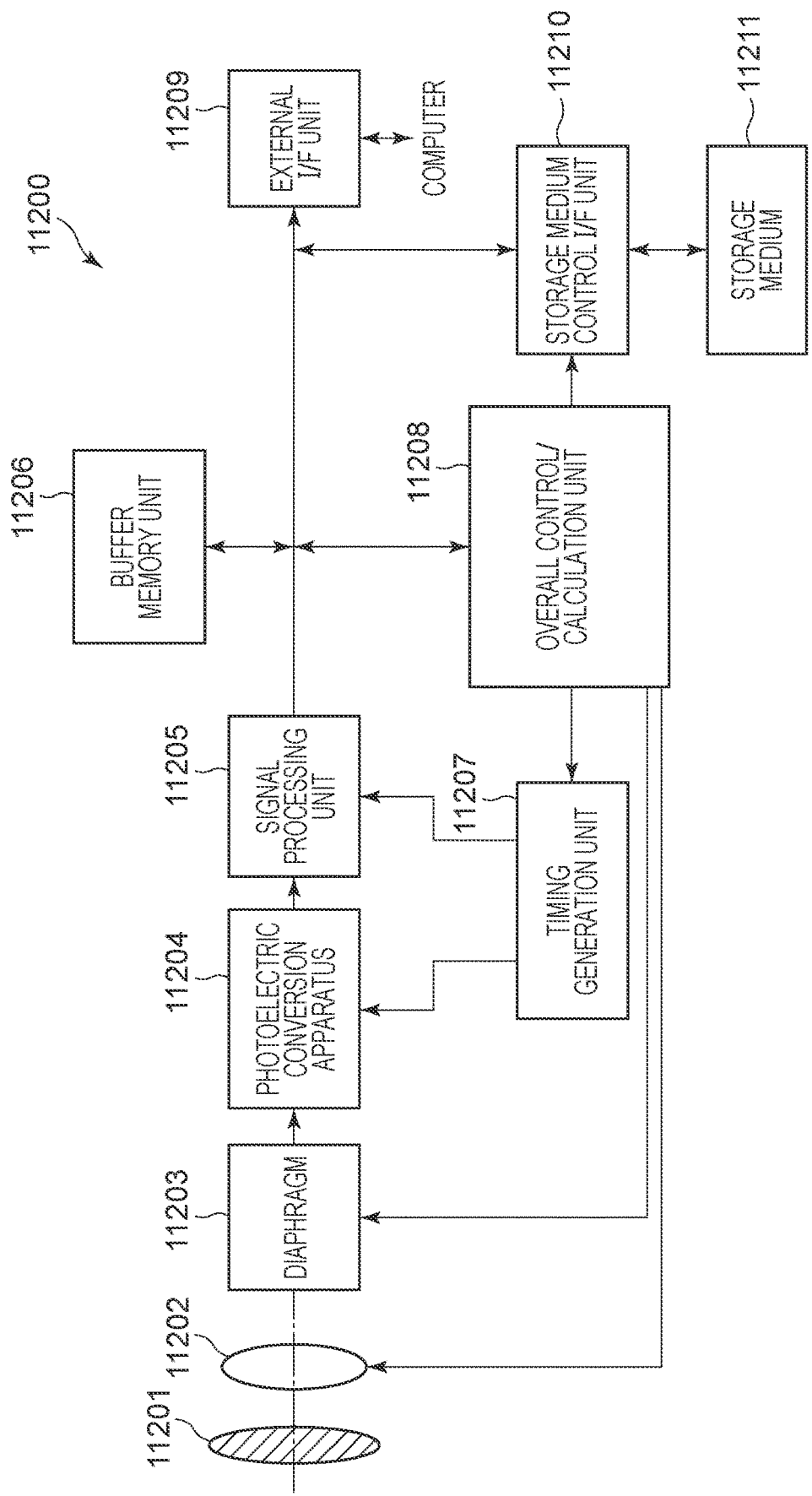
FIG. 16 is a functional block diagram of a photoelectric conversion system.

FIG. 16 is a block diagram showing a configuration of a photoelectric conversion system 11200 according to a seventh embodiment. The photoelectric conversion system 11200 according to this embodiment includes a photoelectric conversion apparatus 11204. As for the photoelectric conversion apparatus 11204, the photoelectric conversion apparatus according to one of embodiments described above may be used. The photoelectric conversion system 11200 may be used, for example, as an imaging system. Specific examples of the imaging system include a digital still camera, a digital camcorder, a security camera, a network camera, and the like. In the example shown in FIG. 16, the photoelectric conversion system 11200 is used as a digital still camera.

The photoelectric conversion system 11200 shown in FIG. 16 includes a photoelectric conversion apparatus 11204 and a lens 11202 that forms an optical image of a subject on the photoelectric conversion apparatus 11204. The photoelectric conversion system 11200 further includes a diaphragm 11203 for varying the amount of light passing through the lens 11202, and a barrier 11201 for protecting the lens 11202. The lens 11202 and the diaphragm 11203 constitute an optical system that focuses light on the photoelectric conversion apparatus 11204.

The photoelectric conversion system 11200 also includes a signal processing unit 11205 that processes an output signal provided from the photoelectric conversion apparatus 11204. The signal processing unit 11205 performs signal processing, such as various correction processing, compression processing unit, on the input signal as necessary, and outputs the resultant signal. The photoelectric conversion system 11200 further includes a buffer memory unit 11206 for temporarily storing image data and an external interface unit (external I/F unit) 11209 for communicating with an external computer or the like. The photoelectric conversion system 11200 further includes a storage medium 11211 such as a semiconductor memory for storing and reading image data, and a storage medium control interface unit 11210 (storage medium control I/F unit) via which to store or read image data in/from the storage medium 11211. The storage medium 11211 may be disposed inside the photoelectric conversion system 11200 or may be detachable. Communication between the storage medium control I/F unit 11210 and the storage medium 11211 and/or communication with the external I/F unit 11209 may be performed wirelessly.

The photoelectric conversion system 11200 further includes an overall control/calculation unit 11208 that performs various calculations and controls the entire digital still camera, and a timing generation unit 11207 that outputs various timing signals to the photoelectric conversion apparatus 11204 and the signal processing unit 11205. The timing signal or the like may be input from the outside. In this case, the photoelectric conversion system 11200 may include at least the photoelectric conversion apparatus 11204 and the signal processing unit 11205 that processes an output signal provided from the photoelectric conversion apparatus 11204. The overall control/calculation unit 11208 and the timing generation unit 11207 may be configured to perform part or all of the control functions of the photoelectric conversion apparatus 11204.

The photoelectric conversion apparatus 11204 outputs an image signal to the signal processing unit 11205. The signal processing unit 11205 performs particular signal processing on the image signal output from the photoelectric conversion apparatus 11204, and outputs resultant image data. Furthermore, the signal processing unit 11205 generates an image using the image signal. The signal processing unit 11205 may perform a distance measurement calculation on the signal output from the photoelectric conversion apparatus 11204. The signal processing unit 11205 and the timing generation unit 11207 may be disposed on the photoelectric conversion apparatus. That is, the signal processing unit 11205 and the timing generation unit 11207 may be disposed on a substrate on which pixels are arranged, or may be disposed on another substrate. By forming an imaging system using the photoelectric conversion apparatus according to one of the embodiments described above, it is possible to realize an imaging system capable of acquiring a higher quality image.

Eighth Embodiment

Figure 17:
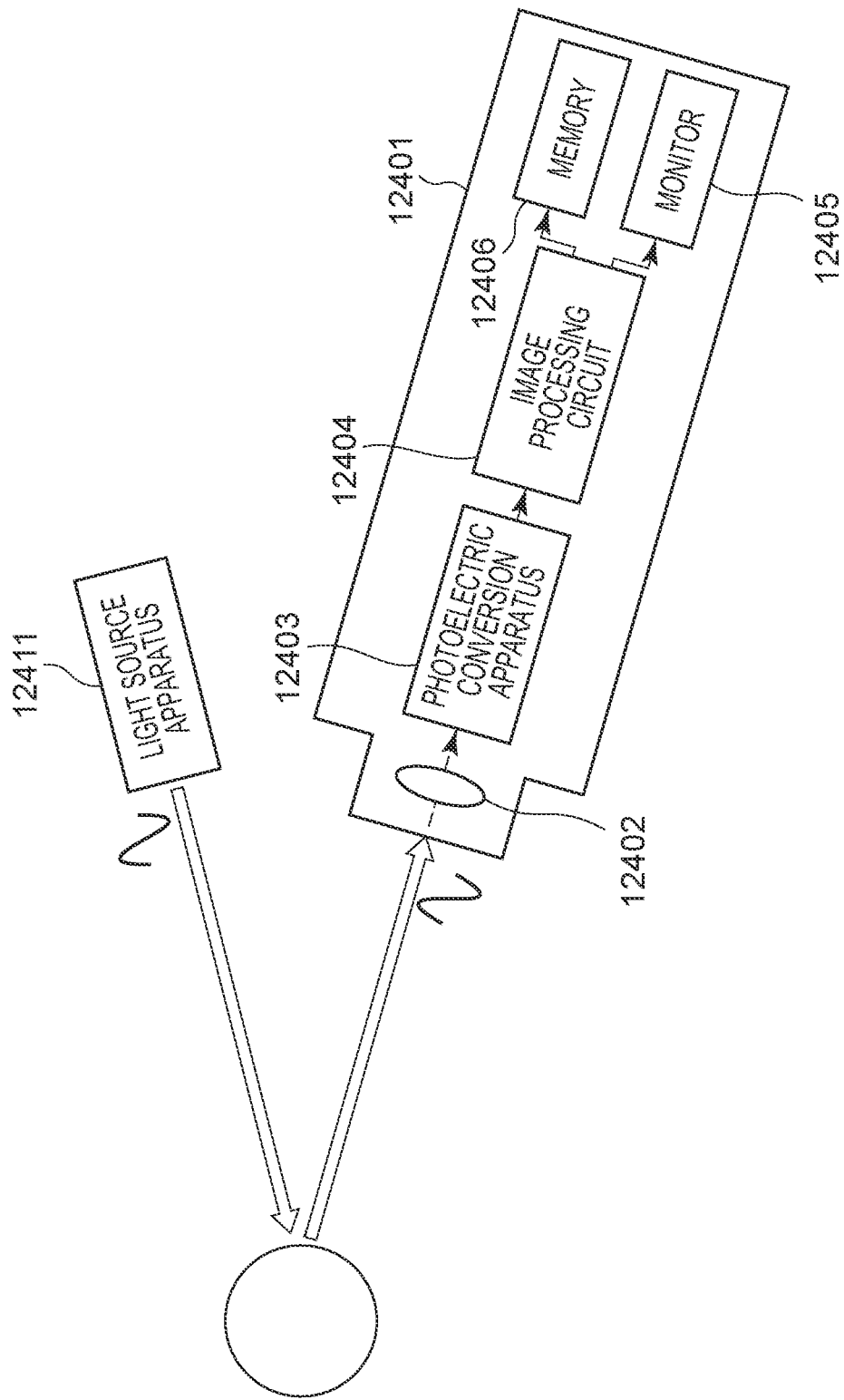
FIG. 17 is a functional block diagram of a distance sensor.

FIG. 17 is a block diagram showing an example of a configuration of a distance image sensor, which is an electronic device realized using the photoelectric conversion apparatus according to one of the embodiments described above.

As shown in FIG. 17, the distance image sensor 12401 includes an optical system 12407, a photoelectric conversion apparatus 12408, an image processing circuit 12404, a monitor 12405, and a memory 12406. The distance image sensor 12401 acquires a distance image indicating a distance to a subject by receiving light (modulated light or pulsed light) that is projected from a light source apparatus 12409 toward the subject and reflected by the surface of the subject.

The optical system 12407 includes one or a plurality of lenses and functions to conduct image light (incident light) from a subject to the photoelectric conversion apparatus 12408 so as to form an image on a light receiving surface (a sensor unit) of the photoelectric conversion apparatus 12408.

As the photoelectric conversion apparatus 12408, the photoelectric conversion apparatus according to one of the embodiments described above is used. A distance signal indicating a distance is obtained from a light reception signal output from the photoelectric conversion apparatus 12408, and the resultant distance signal is supplied to the image processing circuit 12404.

The image processing circuit 12404 performs image processing for constructing a distance image based on the distance signal supplied from the photoelectric conversion apparatus 12408. The distance image (image data) obtained by the image processing is supplied to the monitor 12405 and displayed thereon, or supplied to the memory 406 and stored (recorded) therein.

In the distance image sensor 12401 configured in the above-described manner, use of the photoelectric conversion apparatus with higher-quality pixels described above makes it possible to acquire, for example, a more accurate distance image.

Ninth Embodiment

The techniques according to the present disclosure (the present techniques) can be applied to various products. For example, the techniques according to the present disclosure may be applied to endoscopic surgery systems.

Figure 18:
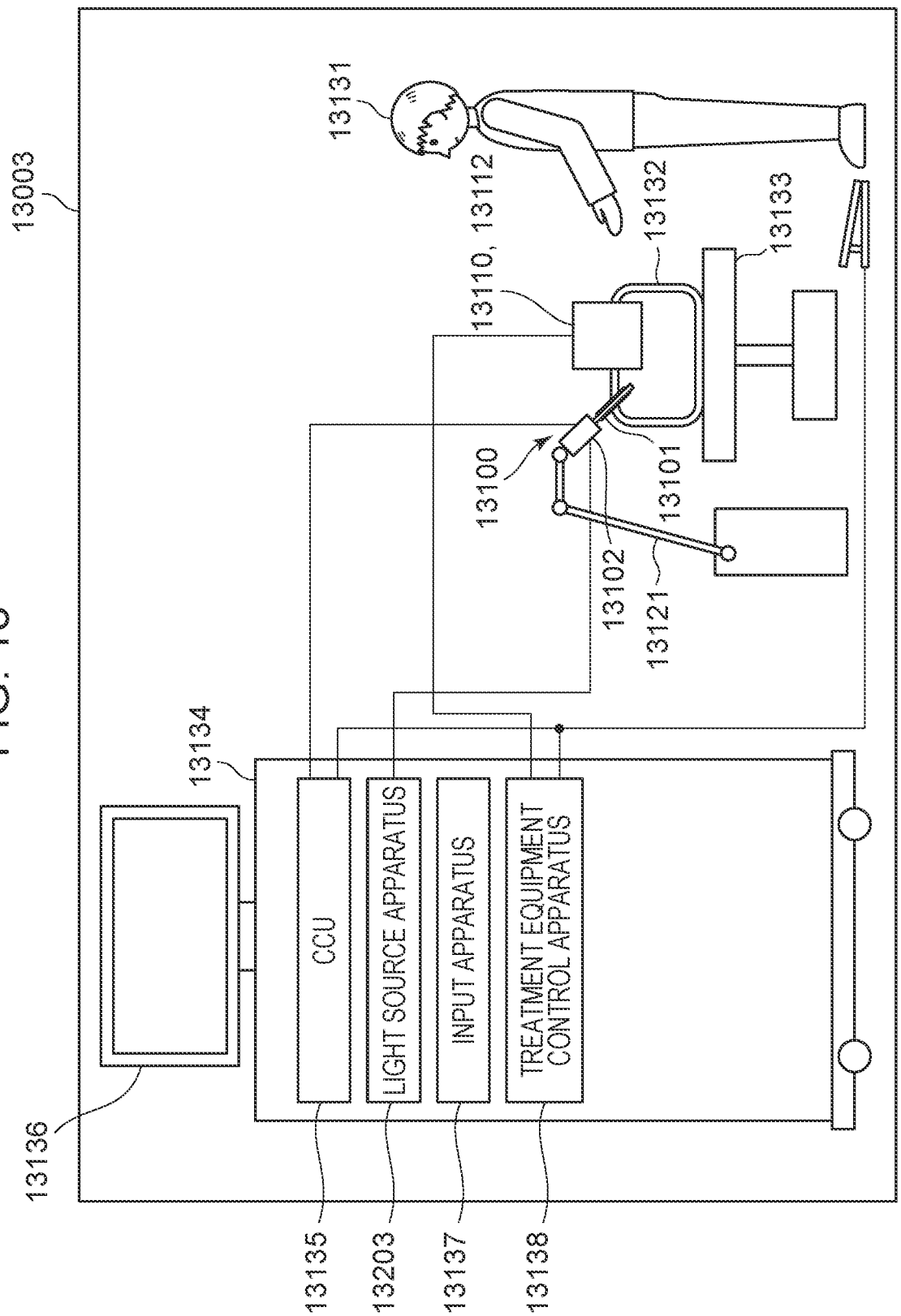
FIG. 18 is a functional block diagram of endoscopic surgery system.

FIG. 18 is a schematic diagram showing an example of a configuration of an endoscopic surgery system to which the technique according to the present disclosure (the present technique) can be applied.

More specifically, FIG. 18 illustrates a manner in which a surgeon (doctor) 13131 performs surgery on a patient 13132 on a patient bed 13133 using an endoscopic surgery system 13003. As shown, the endoscopic surgery system 13003 includes an endoscope 13100, a surgical tool 13110, and a cart 13134 equipped with various apparatuses for endoscopic surgery.

The endoscope 13100 includes a lens barrel 13101 whose anterior part with a particular length is inserted in body cavity of the patient 13132, and a camera head 13102 connected to a base end of the lens barrel 13101. In the example shown in FIG. 18, the endoscope 13100 is configured as a so-called rigid endoscope having the rigid barrel 13101. However the endoscope 13100 may be configured as a so-called flexible endoscope having a flexible barrel.

An opening in which an objective lens is fitted is formed at the tip of the lens barrel 13101. A light source apparatus 13203 is connected to the endoscope 13100. Light generated by the light source apparatus 13203 is guided to the tip of the lens barrel by a light guide extending inside the lens barrel 13101. This light is emitted through the objective lens toward an observation target object in the body cavity of the patient 13132. The endoscope 13100 may be a forward-viewing endoscope, a forward-oblique viewing endoscope, or a side viewing endoscope.

An optical system and a photoelectric conversion apparatus are provided inside the camera head 13102, and reflected light (observation light) from the observation target object is focused on the photoelectric conversion apparatus by the optical system. The observation light is photoelectrically converted by the photoelectric conversion apparatus into an electric signal corresponding to the observation light. As a result, an image signal corresponding to the observation image is obtained. As the photoelectric conversion apparatus, the photoelectric conversion apparatus according to one of the embodiments described above may be used. The image signal is transmitted as RAW data to the camera control unit (CCU) 13135.

The CCU 13135 includes a CPU (Central Processing Unit), a GPU (Graphics Processing Unit), etc., and generally controls the operations of the endoscope 13100 and the display apparatus 13136. Furthermore, the CCU 13135 receives the image signal from the camera head 13102, and performs various image processing such as development processing (demosaic processing) on the image signal for displaying an image based on the image signal.

The display apparatus 13136 displays, under the control of the CCU 13135, the image based on the image signal subjected to the image processing by the CCU 13135.

The light source apparatus 13203 includes a light source such as an LED (Light Emitting Diode), and supplies irradiation light to the endoscope 13100 when an image of an operation part or the like is captured.

The input apparatus 13137 functions as an input interface to the endoscopic surgery system 13003. A user can input various information and instructions to the endoscopic surgery system 13003 via the input apparatus 13137.

The treatment equipment control apparatus 13138 controls driving of energy treatment equipment 13112 for cauterization or incision of a tissue, sealing of blood vessels, etc.

The light source apparatus 13203 for supplying irradiation light to the endoscope 13100 when an image of an operation part is captured may be realized using a white light source using an LED, a laser light source, or a combination thereof. In a case where the white light source is realized by a combination of RGB laser light sources, it is possible to accurately control the output intensity and output timing of each color (each wavelength), and thus the light source apparatus 13203 can adjust the white balance of the captured image. Furthermore, in this case, an image may be captured such that the laser light from each of the RGB laser light sources is supplied to the observation target object in a time-division manner, and the imaging device of the camera head 13102 is driven in synchronization with the light supplying timing so as to capture an image of each color in the time-division manner. In this method, a color image can be obtained without providing a color filter on the imaging device.

The light source apparatus 13203 may be controlled such that the intensity of the output light is changed at particular time intervals. By controlling the imaging device of the camera head 13102 to be driven in synchronization with the timing of the change in the light intensity to acquire images in a time-division manner and combining the images, it is possible to generate an image with a high dynamic range without having underexposure and overexposure.

The light source apparatus 13203 may be configured to be able to supply light in a particular wavelength band for special light observation. The special light observation is realized by using, for example, dependence of absorption of light by body tissues on wavelength of light absorption in body tissues. More specifically, a target issue such as a blood vessel on the surface layer of a mucous membrane may be irradiated with light with a narrow band compared with normal irradiation light (that is, white light) thereby obtaining an image of the target issue with high contrast. Alternatively, the special light observation may be realized by fluorescence observation in which an image is obtained by fluorescence which occurs when a target is irradiated with excitation light. In the fluorescence observation, a body tissue is irradiated with excitation light, and fluorescence that occurs on the body tissue in response to the excitation by light is observed, or a reagent such as indocyanine green (ICG) is locally injected into the body tissue and the body tissue is irradiated with excitation light with a wavelength corresponding to the fluorescence wavelength of the reagent and a resultant fluorescence image is observed. As described above, the light source apparatus 13203 may be configured to be capable of supplying narrow band light and/or excitation light for the special light observation.

Tenth Embodiment

Figure 19A:
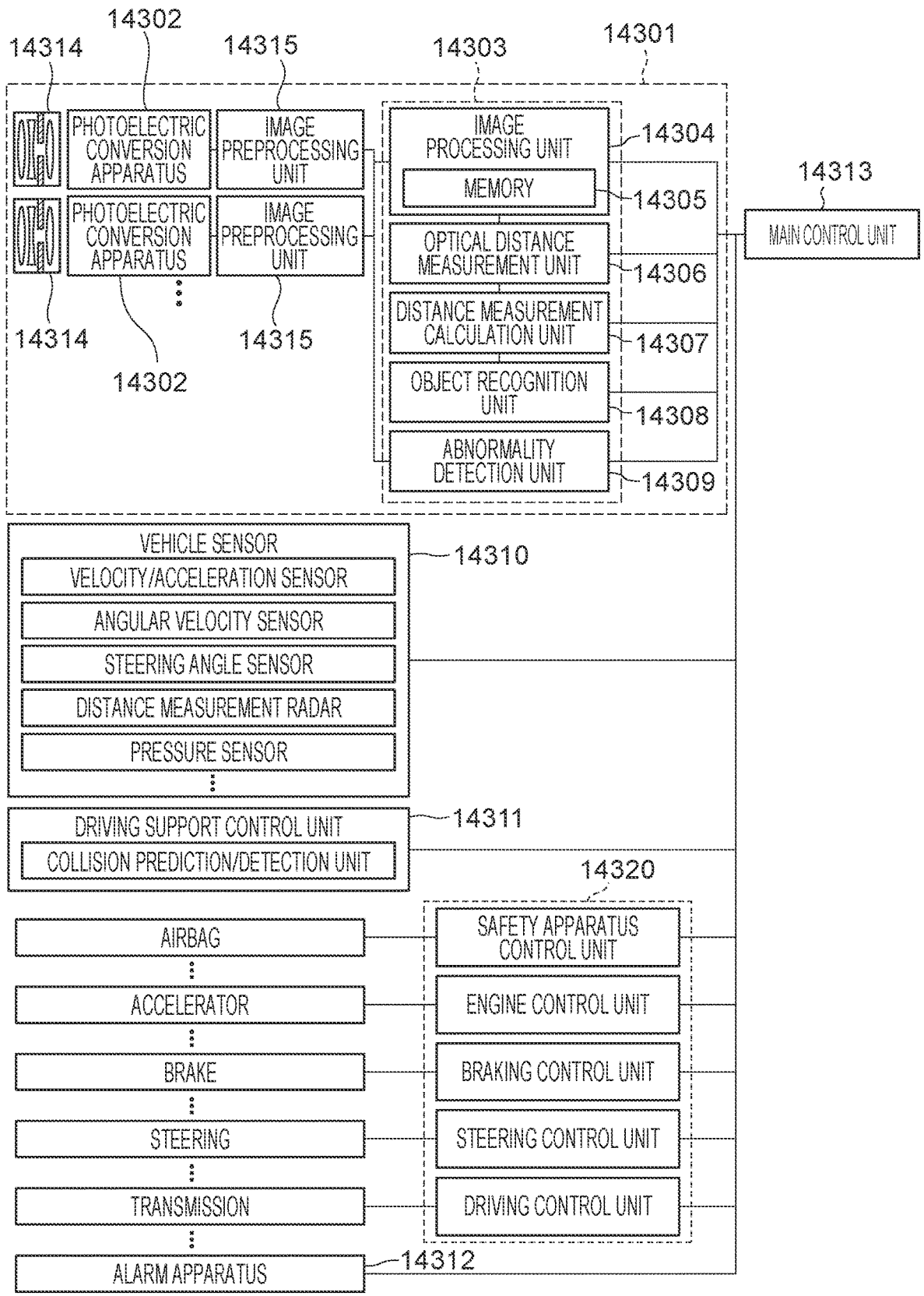

A photoelectric conversion system and a mobile body according to a tenth embodiment are described below with reference to FIGS. 19A, 19B, 20A and 20B. FIGS. 19A and 19B are a schematic view showing an example of a configuration of a photoelectric conversion system and a configuration of a mobile body, respectively, according to the tenth embodiment. In this embodiment, an in-vehicle camera is described as an example of the photoelectric conversion system.

More specifically, FIG. 19A shows an example of a vehicle system and a photoelectric conversion system for imaging which is disposed in the vehicle system. The photoelectric conversion system 14301 includes a photoelectric conversion apparatus 14302, an image preprocessing unit 14315, an integrated circuit 14303, and an optical system 14314. The optical system 14314 forms an optical image of a subject on the photoelectric conversion apparatus 14302. The photoelectric conversion apparatus 14302 converts the optical image of the subject formed by the optical system 14314 into an electric signal. The photoelectric conversion apparatus 14302 may be a photoelectric conversion apparatus according to one of the embodiments described above. The image preprocessing unit 14315 performs particular signal processing on the signal output from the photoelectric conversion apparatus 14302. The function of the image preprocessing unit 14315 may be incorporated in the photoelectric conversion apparatus 14302. The photoelectric conversion system 14301 includes at least two sets of the optical system 14314, the photoelectric conversion apparatus 14302, and the image preprocessing unit 14315, and is configured such that a signal output from the image preprocessing unit 14315 of each set is input to the integrated circuit 14303.

The integrated circuit 14303 is an integrated circuit designed for use in imaging system applications, and includes an image processing unit 14304 including a memory 14305, an optical distance measurement unit 14306, a distance measurement calculation unit 14307, an object recognition unit 14308, and an abnormality detection unit 14309. The image processing unit 14304 performs image processing such as development processing and/or defect correction processing on the output signal provided from the image preprocessing unit 14315. The memory 14305 temporarily stores the captured image and information indicating a position of a defect pixel. The optical distance measurement unit 14306 performs focusing of an image of a subject, and distance measurement processing. The distance measurement calculation unit 14307 calculates the distance from a plurality of image data acquired by the plurality of photoelectric conversion apparatuses 14302 thereby obtaining distance measurement information. The object recognition unit 14308 recognizes a subject such as a car, a road, a sign, or a person. When the abnormality detection unit 14309 detects an abnormality in the photoelectric conversion apparatus 14302, the abnormality detection unit 14309 notifies a main control unit 14313 of the abnormality.

The integrated circuit 14303 may be realized by hardware designed for dedicated use or by a software module, or may be realized by a combination thereof. Alternatively, the integrated circuit 14303 may be realized by an FPGA (Field Programmable Gate Array), an ASIC (Application Specific Integrated Circuit), or the like, or may be realized by a combination thereof.

The main control unit 14313 generally controls the operations of the photoelectric conversion system 14301, the vehicle sensor 14310, the control unit 14320, and the like. The main control unit 14313 may not be provided. In this case, a communication interface may be provided in each of the photoelectric conversion system 14301, the vehicle sensor 14310, and the control unit 14320, and a control signal may be transmitted among the photoelectric conversion system 14301, the vehicle sensor 14310, and the control unit 14320 via a communication network (according to, for example, CAN standard).

The integrated circuit 14303 has a function of transmitting a control signal or a setting value to the photoelectric conversion apparatus 14302 according to a control signal received from the main control unit 14313 or according to a control signal generated inside the integrated circuit 14303.

The photoelectric conversion system 14301 is connected to the vehicle sensor 14310, and can detect a running state in terms of the vehicle speed, yaw rate, steering angle and the like of the vehicle on which the photoelectric conversion system 14301 is disposed and also can detect a state of the environment outside the vehicle, the state of other vehicles/obstacles. The vehicle sensor 14310 also functions as a distance information acquisition unit for acquiring distance information indicating a distance to an object. The photoelectric conversion system 14301 is connected to a driving support control unit 1311 that provides various driving support such as automatic steering, automatic cruising, collision prevention, and/or the like. A collision prediction/detection function is also provided. In this function, a collision with another vehicle/object is predicted or an occurrence of a collision is detected based on a detection result provided by the photoelectric conversion system 14301 and/or the vehicle sensor 14310. When a collision is predicted, a control operation to avoid the collision is performed, and a safety apparatus is activated in the event of the collision.

The photoelectric conversion system 14301 is also connected to an alarm apparatus 14312 that issues an alarm to a driver based on the prediction/detection result by the collision prediction/detection unit. For example, in a case where the prediction/detection result by the collision prediction/detection unit indicates that a collision is going to occur with a high probability, the main control unit 14313 controls the vehicle to avoid the collision or reduce a damage by applying the brakes, releasing the accelerator, or suppressing the engine output.

The alarm apparatus 14312 warns the user by sounding an alarm, displaying alarm information on a display screen of a car navigation system or a meter panel, or vibrating a seat belt or a steering wheel.

In the present embodiment, an image around the vehicle is captured by the photoelectric conversion system 14301. More specifically, for example, an image of an environment in front of or behind the vehicle is captured. FIG. 19B shows an example of a manner of disposing the photoelectric conversion systems 14301 for a case where an image of an environment in front of the vehicle is captured by the photoelectric conversion system 14301.

The two photoelectric conversion apparatuses 14302 are disposed on the front of the vehicle 14300. More specifically, the center line of the external shape (for example, the width) of the vehicle 14300 extending in forward/backward running direction is taken as an axis of symmetry, and the two photoelectric conversion apparatuses 1302 are disposed line-symmetrically about the axis of symmetry. In one embodiment, this configuration is used for acquiring distance information indicating the distance between the vehicle 14300 and an imaging target object, and for determining the possibility of collision.

In one embodiment, the photoelectric conversion apparatuses 14302 are disposed so as not to obstruct the field of view of the driver who is trying to view the situation outside the vehicle 14300 from the driver's seat. The alarm apparatus 14312 is disposed such that the driver can be easily view the alarm apparatus 14312.

In the embodiment described above, by way of example, the control is performed to avoid a collision with another vehicle. However, the present embodiment can also be applied to a control to automatically drive following another vehicle, a control to automatically drive so as not to go out of a lane, and the like. Furthermore, the photoelectric conversion system 14301 can be applied not only to a vehicle but also to a mobile body (a mobile apparatus) such as a ship, an aircraft, an industrial robot, and/or the like. Furthermore, it can be applied not only to mobile bodies but also to a wide variety of devices that use object recognition processing, such as intelligent transportation systems (ITS).

The photoelectric conversion apparatus according to the present disclosure may be configured to be capable of acquiring various information such as distance information.

Eleventh Embodiment

Figure 20A:
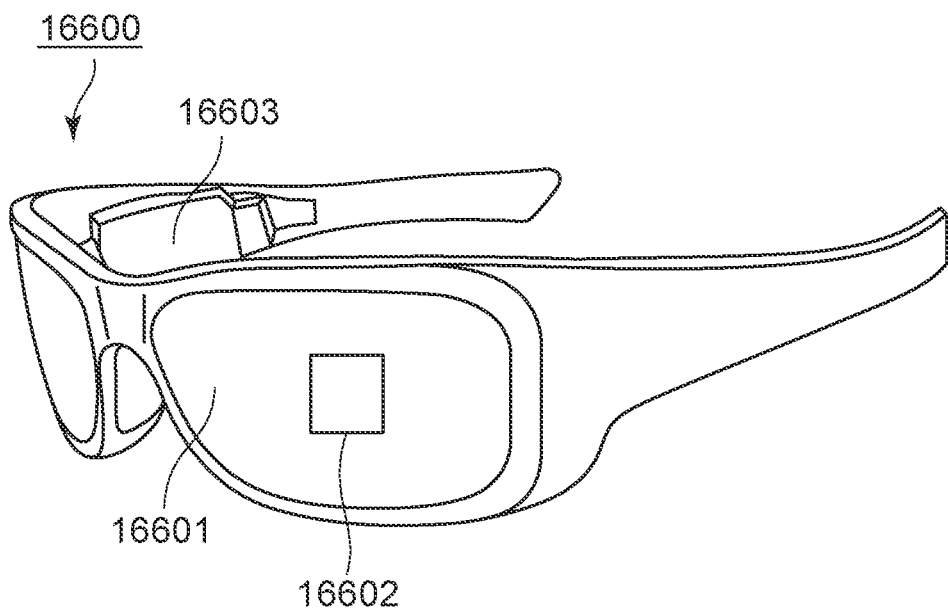
FIGS. 20A and 20B each are a schematic view of smart glasses.

FIG. 20A illustrates, as one of examples of applications, eyeglasses 16600 (smart glasses). The eyeglasses 16600 have a photoelectric conversion apparatus 16602. The photoelectric conversion apparatus 16602 may be a photoelectric conversion apparatus according to one of the embodiments described above. A display apparatus including a light emitting device such as an OLED or an LED may be provided on a back surface side of a lens 16601. One or more photoelectric conversion apparatuses 16602 may be provided. When a plurality of photoelectric conversion apparatuses are used, types thereof may be the same or different. The positions where the photoelectric conversion apparatuses 16602 are disposed is not limited to those shown in FIG. 17A.

The eyeglasses 16600 further include a control apparatus 16603. The control apparatus 16603 functions as a power source for supplying power to the photoelectric conversion apparatus 16602 and to the display apparatus described above. The control apparatus 16603 controls the operations of the photoelectric conversion apparatus 16602 and the display apparatus. The lens 16601 has an optical system for condensing light on the photoelectric conversion apparatus 16602.

Figure 20B:
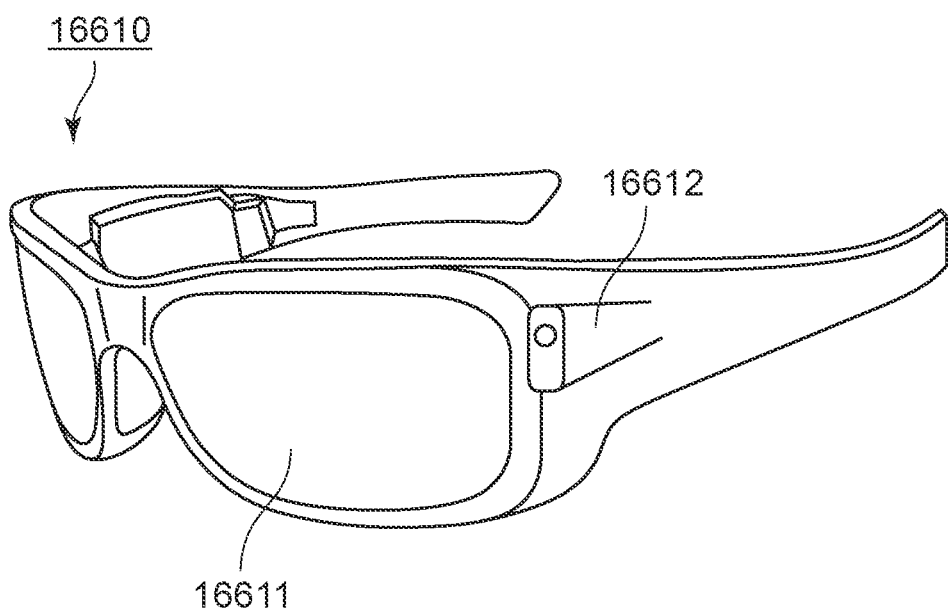

FIG. 20B illustrates another example of eyeglasses 16610 (smart glasses).

The eyeglasses 16610 has a control apparatus 16612, wherein the control apparatus 16612 includes a display apparatus and a photoelectric conversion apparatus corresponding to the photoelectric conversion apparatus 16602. The lens 16611 has an optical system to project light generated by the display apparatus and the photoelectric conversion apparatus in the control apparatus 16612 thereby projecting an image on the lens 16611. The control apparatus 16612 functions as the power source for supplying electric power to the photoelectric conversion apparatus and the display apparatus, and functions to control the operations of the photoelectric conversion apparatus and the display apparatus. The control apparatus may include a line-of-sight detection unit that detects a line of sight of a user who wears the eyeglasses 16610. Infrared light may be used to detect the line of sight. An infrared light emitting unit emits infrared light toward an eyeball of the user who is gazing at the displayed image. An image of the eyeball can be obtained by detecting reflected light of the emitted infrared light from the eyeball by an imaging unit having a light receiving element. By providing a reducing unit for reducing light from the infrared light emitting unit to the display unit as seen in a plan view, the degradation in the image quality is reduced.

The user's line of sight to the displayed image is detected from the image of the eyeball captured using the infrared light. An arbitrary known method can be used in the line-of-sight detection using the captured image of the eyeball. For example, a line-of-sight detection method based on a Purkinje image using reflection of irradiation light on a cornea can be used.

More specifically, the line-of-sight detection process is performed based on a pupillary conical reflex method. The line of sight of the user is detected by calculating a line-of-sight vector representing a direction (a rotation angle) of the eyeball based on the image of the pupil and the Purkinje image included in the captured image of the eyeball using the pupillary corneal reflex method.

The display apparatus according to the present embodiment may include a photoelectric conversion apparatus having a light receiving element, and may control the image displayed on the display apparatus based on the user's line-of-sight information provided from the photoelectric conversion apparatus.

More specifically, the display apparatus determines a first field-of-view area being watched by the user and a second field-of-view area other than the first field-of-view area based on the line-of-sight information. The first field-of-view area and the second field-of-view area may be determined by the control apparatus of the display apparatus, or may receive information indicating the first field-of-view area and the second field-of-view area determined by an external control apparatus. In the display area of the display apparatus, the display resolution of the first field-of-view area may be controlled to be higher than the display resolution of the second field-of-view area. That is, the resolution of the second field-of-view area may be lower than that of the first field-of-view area.

The display area may include a first display area and a second display area different from the first display area. The priorities for the first display area and the second display area may be determined based on the line-of-sight information. The first field-of-view area and the second field-of-view area may be determined by the control apparatus of the display apparatus, or may receive information indicating the first field-of-view area and the second field-of-view area determined by an external control apparatus. The resolution of the higher-priority area may be controlled to be higher than the resolution of the other area. That is, the resolution of the area having a relatively low priority may be controlled to be low.

Note that the determination of the first field-of-view area and the determination of the higher-priority area may be performed using AI. The AI may be based on a model of estimating, from an image of an eyeball, the angle of the line of sight and the distance to a target object ahead of the line of sight, wherein the model is built by learning training data as to images of eyeballs and viewing directions of the eyeballs of the image. The AI program may be possessed by the display apparatus, the photoelectric conversion apparatus, or the external apparatus. In a case where the AI program is possessed by the external apparatus, it is transferred to the display apparatus via communication.

In a case where the displaying is controlled based on the visual detection, it is possible to apply the technique to smart glasses further including a photoelectric conversion apparatus for capturing an image of the outside. Smart glasses can display captured external information in real time.

Twelfth Embodiment

A system according to a twelfth embodiment is described below with reference to FIG. 21. The system according to this twelfth embodiment can be applied to a pathological diagnosis system used by a doctor or the like to observe cells or tissues collected from a patient to diagnose a lesion, or to a diagnosis support system for supporting pathological diagnosis. The system according to the present embodiment may diagnose a lesion or assist the diagnosis based on an acquired image.

Figure 21:
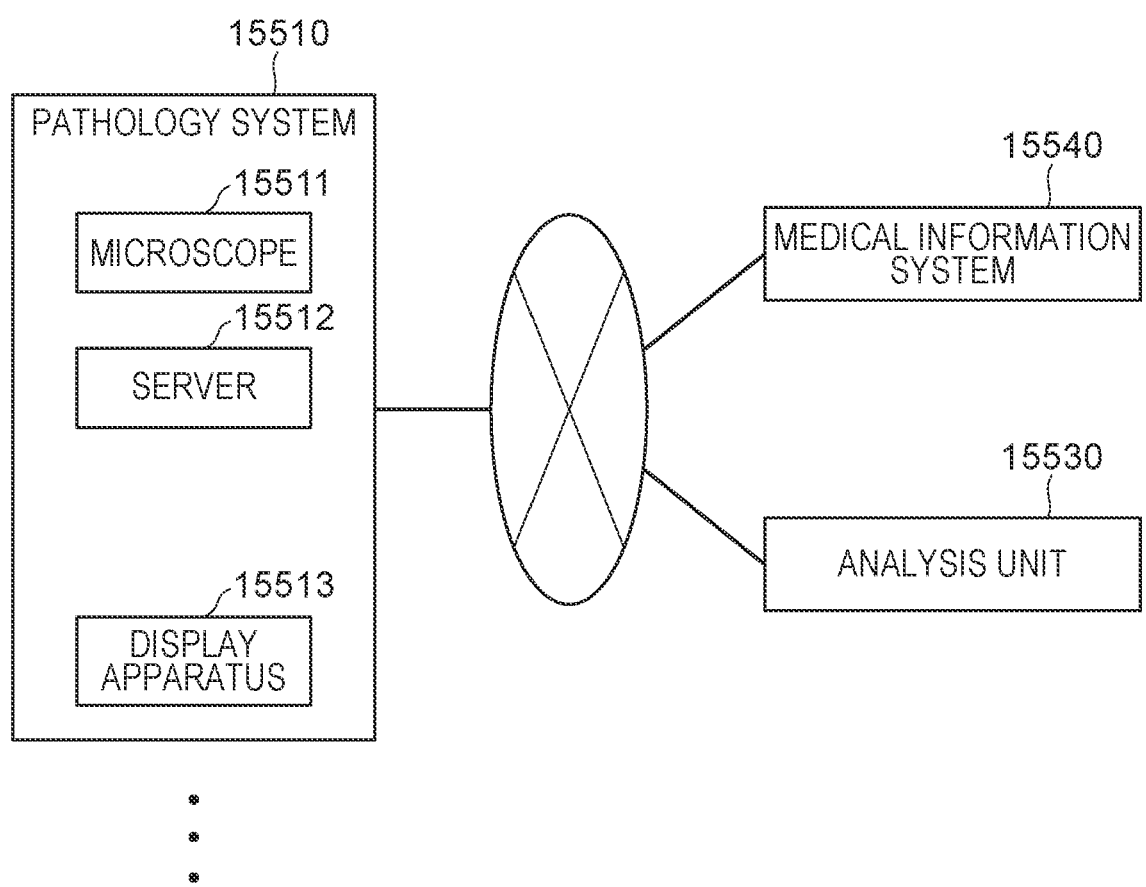
FIG. 21 is a functional block diagram of a diagnostic system.

As shown in FIG. 21, the system according to the present embodiment includes one or more pathology systems 15510. The system may further include an analysis unit 15530 and a medical information system 15540.

Each of one or more pathology systems 15510 is a system mainly used by a pathologist and is installed, for example, in a laboratory or a hospital. The pathology systems 15510 may be installed in different hospitals, and they are connected to the analysis unit 15530 and the medical information system 15540 via various networks such as a wide area network, a local area network, etc.

Each pathology system 15510 includes a microscope 15511, a server 15512, and a display apparatus 15513.

The microscope 15511 has a function of an optical microscope, and is used to capture an image of an observation target object placed on a glass slide thereby acquiring a pathological image in the form of a digital image. The observation target object is, for example, a tissue or a cell collected from a patient. More specifically, for example, the observation target object may be a piece of meat of an organ, saliva, blood, or the like.

The server 15512 stores the pathological image acquired by the microscope 15511 in a storage unit (not shown). When the server 15512 receives a browsing request, the server 15512 may search for a pathological image stored in the storage unit (a memory or the like) and may display the retrieved pathological image on the display apparatus 15513. The server 15512 and the display apparatus 15513 may be connected via an apparatus that controls displaying.

In a case where an observation target object is a solid substance such as a piece of meat of an organ, the observation target object may be given, for example, in the form of a stained thin section. The thin section may be prepared, for example, by slicing a block piece cut out from a sample such as an organ into the thin section. When slicing is performed, the block piece may be fixed with paraffin or the like.

The microscope 15511 may include a low-resolution imaging unit for acquiring a low-resolution image and a high-resolution imaging unit for acquiring a high-resolution image. The low-resolution imaging unit and the high-resolution imaging unit may have different optical systems or may share the same optical system. When the same optical system is used, the resolution of the microscope 15511 may be changed depending on the imaging target object.

The observation target object is disposed in a glass slide or the like and placed on a stage located within the angle of view of the microscope 15511. The microscope 15511 first acquires an overall image within the angle of view using the low-resolution imaging unit, and identifies a particular area of the observation target object from the acquired overall image. Subsequently, the microscope 15511 divides the area where the observation target object exists into a plurality of divided areas each having a predetermined size, and sequentially captures images of the respective divided areas by the high-resolution imaging unit thereby acquiring high-resolution images of the respective divided areas. Switching of the divided area to be imaged may be realized by moving the stage or the imaging optical system or both the stage and the imaging optical system. Switching between divided areas may be performed such that there is an overlap between adjacent divided areas in order to prevent an occurrence of missing some part of a divided area due to unintended sliding of the glass slide. The overall image may include identification information for associating the overall image with the patient. This identification information may be given by, for example, a character string, a QR code (registered trademark), or the like.

The high-resolution image acquired by the microscope 15511 is input to the server 15512. The server 15512 may divide each high-resolution image into smaller-size partial images. When the partial images are generated in the manner described above, the server 15512 executes a composition process for generating one image by combining a predetermined number of adjacent partial images into a single image. This compositing process can be repeated until one final partial image is produced. By performing this processing, it is possible to obtain a group of partial images in a pyramid structure in which each layer is composed of one or more partial images. In this pyramid structure, a partial image of a layer has the same number of pixels as the number of pixels of a partial image of another different layer, but the resolution is different between layers. For example, when a total of 2×2 partial images are combined to generate one partial image in an upper layer, the resolution of the partial image in the upper layer is ½ times the resolution of the partial images in a lower layer used for the composition.

By constructing a partial image group in the pyramid structure, it is possible to switch the detail level of the observation target object displayed on the display apparatus depending on the layer to which the displayed tile images belong. For example, when a lowest-level partial image is used, a small area of the observation target object is displayed in detail, while when a higher-level partial image is used, a larger area of the observation target object is displayed in a coarse manner.

The generated partial image group in the pyramid structure can be stored in, for example, a memory. When the server 15512 receives a request for acquiring a partial image together with identification information from another apparatus device (for example, the analysis unit 15530), the server 15512 transmits the partial image corresponding to the identification information to this apparatus.

A partial image of a pathological image may be generated for each imaging condition such as a focal length, a staining condition, or the like. In a case where a partial image is generated for each imaging condition, partial images may be displayed such that, in addition to a specific pathological image, other pathological images which correspond to imaging conditions different from the imaging condition of the specific pathological image but correspond to the same region as that of the specific pathological image are displayed side by side. The specific imaging condition may be specified by a viewer. In a case where a plurality of imaging conditions are specified by the viewer, pathological images of the same area satisfying the respective imaging conditions may be displayed side by side.

The server 15512 may store a partial image group in the pyramid structure in a storage apparatus other than the server 15512, for example, a cloud server. Part or all of the partial image generation process described above may be executed by a cloud server or the like. By using partial images in the manner described above, a user can observe an observation target object as if the user is actually observing the observation target object while changing the observation magnification. That is, controlling the displaying provides a function of a virtual microscope. The virtual observation magnification actually corresponds to the resolution.

The medical information system 15540 is a so-called electronic medical record system. In this medical information system 15540, information is stored related to diagnosis such as patient identification information, patient disease information, test information and image information used in diagnosis, a diagnosis result, and a prescription. For example, a pathological image obtained by imaging an observation target object of a patient may be stored once in the server 15512 and may be displayed on the display apparatus 15514 later. A pathologist using the pathology system 15510 performs a pathological diagnosis based on the pathological image displayed on the display apparatus 15513. The result of the pathological diagnosis made by the pathologist is stored in the medical information system 15540.

The analysis unit 15530 is capable of analyzing the pathological image. A learning model built by machine learning may be used for the analysis. The analysis unit 15530 may derive a result of classification of a specific area, a result of a tissue identification, or the like as the analysis result. The analysis unit 15530 may further derive a result of cell identification, the number of cells, the position of cell, and luminance information, and scoring information for them. These pieces of information obtained by the analysis unit 15530 may be displayed as diagnostic support information on the display apparatus 15513 of the pathology system 15510.

The analysis unit 15530 may realize by a server system including one or more servers (including a cloud server) and/or the like. The analysis unit 15530 may be incorporated in, for example, the server 15512 in the pathology system 15510. That is, various analysis on the pathological image may be performed within the pathology system 15510.

The photoelectric conversion apparatus according to one of the embodiments may be applied suitably to, for example, the microscope 15511 among the various units. More specifically, the photoelectric conversion apparatus may be applied to the low-resolution imaging unit and/or the high-resolution imaging unit in the microscope 15511. This makes it possible to reduce the size of the low-resolution imaging unit and/or the high-resolution imaging unit, and, as a result, it becomes possible to reduce the size of the microscope 15511. As a result, it becomes easy to transport the microscope 15511, and thus it becomes easy to build the system or modify the system. Furthermore, by using the photoelectric conversion apparatus according to one of the embodiments described above, it becomes possible that part or all of the processes including acquiring an pathological image and other processes until analysis of the pathological image is completed can be executed on the fly by the microscope 15511, and thus it becomes possible to output accurate diagnostic support information quickly.

The techniques described above can be applied not only to the diagnosis support system but can be general applied to biological microscopes such as a confocal microscope, a fluorescence microscope, and a video microscope. The observation target object may be a biological sample such as cultured cells, a fertilized egg, or a sperm, a biomaterial such as a cell sheet or a three-dimensional cell tissue, or a living body such as a zebrafish or a mouse. In the observation, the observation target object is not limited to being placed on a glass slide, but can be stored in a well plate, a petri dish, or the like.

A moving image may be generated from still images of an observation target object acquired using a microscope. For example, a moving image may be generated from still images successively captured in a particular period, or an image sequence may be generated from still images captured at a particular interval. By generating a moving image from still images, it becomes possible to analyze, using machine learning, dynamic features of the observation target object such as beating or elongating of cancer cells, nerve cells, a myocardial tissue, a sperm, etc., movement such as migration, a division process of cultured cells or fertilized eggs, etc.

Thirteenth Embodiment

In a thirteenth embodiment described below, the first signal processing unit 310 and the second signal processing unit 320 are supplied with power from different power supply systems, and the wiring density of the first signal processing unit 310 is higher than the wiring density of the second signal processing unit 320.

There is a possibility that the area of the first signal processing unit 310 on the second substrate 300 is larger than the area of the second signal processing unit 320, as in a case, for example, where unit cells of the processing circuit of the first signal processing unit 310 are provided in a one-to-one correspondence with the unit cells of the pixel part 120. When a long wiring is provided over a large area, a voltage drop may occur due to resistance of the wiring or resistance of a connected element. An influence of the voltage drop is small on the second signal processing unit 320 with a smaller area. In view of the above, the wiring density of the first signal processing unit 310 may be increased thereby reducing the voltage drop of the power supply voltage supplied to the first signal processing unit 310.

In addition, a signal transmitted via a drive wiring may cause power supply voltage to fluctuate. In a case where an analog signal is processed by the first signal processing unit 310, a fluctuation of the power supply voltage can have a great influence on the signal. The second signal processing unit 320 processes digital signals. In view of the above, the wiring density of the first signal processing unit 310 may be increased thereby making it possible to stably supply the power supply voltage while reducing the influence on other wirings.

In the present embodiment, the power supply systems are different for the first signal processing unit 310 and the second signal processing unit 320, but the above-described effects can be obtained also in the case where the same supply systems are used.

Other Embodiments

The present disclosure has been described above with reference to various embodiments. However, the present disclosure is not limited to these embodiments, and various modifications and changes can be made. The embodiments may be mutually applicable. That is, a part of one embodiment may be replaced with a part of another embodiment, or a part of one embodiment may be added to another embodiment. Part of an embodiment may be deleted. The present disclosure may be embedded as a multiplayer semiconductor substrate for forming a semiconductor apparatus or a photoelectric conversion apparatus.

As described above, by implementing the present disclosure, it is possible to provide a wiring structure and configuration capable of effectively reducing at least one of the influences of voltage fluctuations and heat generation that occur in the signal processing unit.

According to the present disclosure, at least one of the power supply fluctuation and heat generation caused by a processing unit can be effectively reduced.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2021-016449, filed Feb. 4, 2021, which is hereby incorporated by reference herein in its entirety.

What is claimed is:
1. An apparatus comprising:
a first substrate having a pixel area in which a plurality of pixels are arranged;
a second substrate superimposed on the first substrate and electrically connected to the first substrate;
a first processing unit for processing signals output from the plurality of pixels; and
a second processing unit for performing a process based on a calculation model on a signal output from the first processing unit,
at least part of the first processing unit and at least part of the second processing unit being disposed on either the first substrate or the second substrate,
a first path for supplying a first power supply voltage to the first processing unit being different from a second path for supplying a second power supply voltage to the second processing unit,
wherein the first power supply voltage is higher than the second power supply voltage.
2. The apparatus according to claim 1, further comprising:
a plurality of pads for making electrical connections with an external apparatus,
wherein the first power supply voltage is supplied via a first pad included in the plurality of pads, and the second power supply voltage is supplied via a second pad included in the plurality of pads.

3. An apparatus comprising:
a first substrate having a pixel area in which a plurality of pixels are arranged;
a second substrate superimposed on the first substrate and electrically connected to the first substrate;
a first processing unit for processing signals output from the plurality of pixels; and
a second processing unit for performing a process based on a calculation model on a signal output from the first processing unit,
at least part of the first processing unit and at least part of the second processing unit being disposed on either the first substrate or the second substrate,
a first path for supplying a first power supply voltage to the first processing unit being different from a second path for supplying a second power supply voltage to the second processing unit;
a plurality of first wirings for supplying the first power supply voltage and a plurality of second wirings for supplying the second power supply voltage,
wherein a wiring width of the plurality of first wirings is substantially equal to a wiring width of the plurality of second wirings, and
a wiring interval of the plurality of second wirings is smaller than a wiring interval of the plurality of second wirings.

4. An apparatus comprising:
a first substrate having a pixel area in which a plurality of pixels are arranged;
a second substrate superimposed on the first substrate and electrically connected to the first substrate;
a first processing unit for processing signals output from the plurality of pixels;
a second processing unit for performing a process based on a calculation model on a signal output from the first processing unit,
at least part of the first processing unit and at least part of the second processing unit being disposed on either the first substrate or the second substrate,
a first path for supplying a first power supply voltage to the first processing unit being different from a second path for supplying a second power supply voltage to the second processing unit;
a plurality of first wirings for supplying the first power supply voltage; and
a plurality of second wirings for supplying the second power supply voltage,
wherein a wiring interval of the plurality of first wirings is substantially equal to a wiring interval of the plurality of second wirings, and
wherein a wiring width of the plurality of second wirings is larger than a wiring width of the plurality of second wirings.

5. The apparatus according to claim 3, wherein
a principal direction of the plurality of first wirings intersects a principal direction of the plurality of second wirings when seen in a plan view.

6. The apparatus according to claim 2, further comprising:
a first wiring layer disposed between the first substrate and the second substrate; and
a second wiring layer to which a distance from the first substrate is different from a distance to the first wiring layer from the first substrate,
wherein the first wiring layer includes the plurality of first wirings, and
wherein the second wiring layer includes the plurality of second wirings.

7. The apparatus according to claim 1, wherein
the pixel area and the first processing unit are disposed so as to overlap each other when seen in a plan view.

8. The apparatus according to claim 1, wherein
the pixel area and the second processing unit are disposed so as not to overlap each other when seen in a plan view.

9. An apparatus comprising:
a first substrate having a pixel area in which a plurality of pixels are arranged;
a second substrate superimposed on the first substrate and electrically connected to the first substrate;
a first processing unit for processing signals output from the plurality of pixels; and
a second processing unit for performing a process based on a calculation model on a signal output from the first processing unit,
at least part of the first processing unit and at least part of the second processing unit being disposed on either the first substrate or the second substrate,
a first path for supplying a first power supply voltage to the first processing unit being different from a second path for supplying a second power supply voltage to the second processing unit; and
a plurality of first pads to which the plurality of first wirings are connected, and a plurality of second pads to which the plurality of second wirings are connected,
wherein the second pads are larger in number than the first pads.

10. A system, comprising:
the apparatus according to claim 1; and
a processing unit configured to generate an image using a signal output by the apparatus.

11. The system according to claim 10, wherein the apparatus further comprises:
a plurality of pads for making connections with an external apparatus,
wherein the first power supply voltage is supplied via a first pad included in the plurality of pads, and the second power supply voltage is supplied via a second pad in the plurality of pads.

12. The system according to claim 10, wherein the apparatus further comprises:
a plurality of first wirings for supplying the first power supply voltage and a plurality of second wirings for supplying the second power supply voltage,
wherein a wiring width of the plurality of first wirings is substantially equal to a wiring width of the plurality of second wirings, and
a wiring interval of the plurality of second wirings is smaller than a wiring interval of the plurality of second wirings.

13. The system according to claim 10, wherein the apparatus further comprises:
a plurality of first wirings for supplying the first power supply voltage; and
a plurality of second wirings for supplying the second power supply voltage,
wherein a wiring interval of the plurality of first wirings is substantially equal to a wiring interval of the plurality of second wirings, and
wherein a wiring width of the plurality of second wirings is larger than a wiring width of the plurality of second wirings.

14. A mobile body comprising:
the apparatus according to claim 1; and
a control unit configured to control a movement of the mobile body using a signal output by the apparatus.

15. The mobile body according to claim 14, wherein the apparatus further comprises:
a plurality of pads for making connections with an external apparatus,
wherein the first power supply voltage is supplied via a first pad included in the plurality of pads, and the second power supply voltage is supplied via a second pad included in the plurality of pads.

16. The mobile body according to claim 14, wherein the apparatus further comprises:
a plurality of first wirings for supplying the first power supply voltage and a plurality of second wirings for supplying the second power supply voltage,
wherein a wiring width of the plurality of first wirings is substantially equal to a wiring width of the plurality of second wirings, and
a wiring interval of the plurality of second wirings is smaller than a wiring interval of the plurality of second wirings.

17. The mobile body according to claim 14, wherein the apparatus further comprises:
a plurality of first wirings for supplying the first power supply voltage; and
a plurality of second wirings for supplying the second power supply voltage,
wherein a wiring interval of the plurality of first wirings is substantially equal to a wiring interval of the plurality of second wirings, and
wherein a wiring width of the plurality of second wirings is larger than a wiring width of the plurality of second wirings.

18. A substrate for use in a multiplayer structure, comprising:
a first processing unit for processing signals output from a plurality of pixels disposed on another substrate, and
a second processing unit for performing a process based on a calculation model on a signal output from the first processing unit,
a first power supply voltage and a second power supply voltage being supplied respectively, via different paths, to the first processing unit and the second processing unit,
wherein the first power supply voltage is higher than the second power supply voltage.

19. A system, comprising:
the apparatus according to claim 3; and
a processing unit configured to generate an image using a signal output by the apparatus.

20. A system, comprising:
the apparatus according to claim 4; and
a processing unit configured to generate an image using a signal output by the apparatus.

21. A system, comprising:
the apparatus according to claim 9; and
a processing unit configured to generate an image using a signal output by the apparatus.

* * * * *